United States Patent
Newman et al.

(10) Patent No.: US 9,783,885 B2
(45) Date of Patent: *Oct. 10, 2017

(54) METHODS FOR PRODUCING DIAMOND MASS AND APPARATUS THEREFOR

(71) Applicants: Arnold L. Newman, Bethesda, MD (US); Daniel Hodes, Bethesda, MD (US)

(72) Inventors: Arnold L. Newman, Bethesda, MD (US); Daniel Hodes, Bethesda, MD (US)

(73) Assignee: Unit Cell Diamond LLC, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/713,043

(22) Filed: May 15, 2015

(65) Prior Publication Data

US 2015/0259790 A1 Sep. 17, 2015

Related U.S. Application Data

(63) Continuation-in-part of application No. 14/120,508, filed on May 28, 2014, now Pat. No. 9,061,917, (Continued)

(51) Int. Cl.
*C23C 16/27* (2006.01)
*C23C 16/44* (2006.01)
(Continued)

(52) U.S. Cl.
CPC ............ *C23C 16/27* (2013.01); *B01J 19/088* (2013.01); *B01J 19/121* (2013.01); *B01J 19/126* (2013.01);
(Continued)

(58) Field of Classification Search
None
See application file for complete search history.

(56) References Cited

U.S. PATENT DOCUMENTS 3,630,768 A 12/1971 Bianchi et al.
4,434,188 A 2/1984 Kanno
(Continued)

FOREIGN PATENT DOCUMENTS

JP 2001148487 A 5/2001
WO WO 88/02792 4/1988
(Continued)

OTHER PUBLICATIONS

Maier, et al., "Tert-Butyl-Substituierte Cyclobutadiene Und Cyclopentadienone" Tetrahedron Letters No. 11, pp. 1025-1030, 1972.
(Continued)

*Primary Examiner* — Guinever S Gregorio
(74) *Attorney, Agent, or Firm* — William E. Beaumont; Juneau & Mitchell

(57) ABSTRACT

Methods and apparatus are disclosed for producing diamond masses and products thereof using diamond unit cell forming reactions in vapor phase and solid phase. The present invention enables the fabrication of diamond products having a purity and morphology previously unattainable.

16 Claims, 10 Drawing Sheets

X = -CH=CH-, CO, or -N=N-

Related U.S. Application Data which is a continuation-in-part of application No. 13/204,218, filed on Aug. 5, 2011, now Pat. No. 8,778,295.

(60) Provisional application No. 61/344,510, filed on Aug. 11, 2010.

(51) Int. Cl.
| | |
|---|---|
| *C23C 16/52* | (2006.01) |
| *C23C 16/458* | (2006.01) |
| *B01J 19/12* | (2006.01) |
| *C01B 31/06* | (2006.01) |
| *B01J 19/08* | (2006.01) |

(52) U.S. Cl.
CPC ............ *B01J 19/129* (2013.01); *C01B 31/06* (2013.01); *C23C 16/4412* (2013.01); *C23C 16/458* (2013.01); *C23C 16/52* (2013.01); *B01J 2219/0877* (2013.01); *B01J 2219/123* (2013.01)

(56) References Cited

U.S. PATENT DOCUMENTS

| | | | |
|---|---|---|---|
| 4,849,199 A | 7/1989 | Pinneo | |
| 5,051,785 A | 9/1991 | Beetz | |
| 5,145,712 A | 9/1992 | Jesser et al. | |
| 5,180,571 A * | 1/1993 | Hosoya | C23C 16/01 117/915 |
| 5,201,986 A | 4/1993 | Ota | |
| 5,217,700 A | 6/1993 | Kurihare | |
| 5,270,077 A | 12/1993 | Knemeyer | |
| 5,284,709 A | 2/1994 | Herb | |
| 5,286,524 A | 2/1994 | Knemeyer | |
| 5,310,703 A | 5/1994 | Visser et al. | |
| 5,391,409 A * | 2/1995 | Shibata | C23C 16/274 427/249.8 |
| 5,470,661 A | 11/1995 | Bailey | |
| 5,507,987 A | 4/1996 | Windischmann | |
| 5,547,716 A | 8/1996 | Thaler et al. | |
| 5,569,501 A | 10/1996 | Bailey et al. | |
| 5,849,079 A | 12/1998 | Gruen | |
| 5,981,057 A | 11/1999 | Collins | |
| 6,060,118 A | 5/2000 | Ishikura | |
| 6,319,439 B1 | 11/2001 | Lee | |
| 6,342,195 B1 | 1/2002 | Roy et al. | |
| 6,858,080 B2 | 2/2005 | Linares | |
| 7,037,370 B2 | 5/2006 | Mearini | |
| 7,132,309 B2 | 11/2006 | Sung | |
| 7,306,778 B2 | 12/2007 | Chaffin | |
| 7,368,013 B2 | 5/2008 | Sung | |
| RE41,189 E | 4/2010 | Li | |
| 7,833,505 B2 | 11/2010 | Donnet et al. | |
| 7,842,134 B2 | 11/2010 | Whitehead | |
| 7,938,997 B2 | 5/2011 | Zhao et al. | |
| 8,171,568 B2 | 5/2012 | Freitas et al. | |
| 8,276,211 B1 | 9/2012 | Freitas et al. | |
| 8,778,295 B2 * | 7/2014 | Hodes | C01B 31/06 117/79 |
| 9,061,917 B2 * | 6/2015 | Hodes | C01B 31/06 |
| 2003/0131787 A1 | 7/2003 | Linares | |
| 2004/0258918 A1 | 12/2004 | Chaffin | |
| 2005/0168122 A1 | 8/2005 | Dahl et al. | |
| 2009/0093659 A1 * | 4/2009 | Freitas, Jr. | C07C 2/00 585/21 |
| 2010/0015438 A1 | 1/2010 | Williams | |
| 2011/0014112 A1 | 1/2011 | Misra | |
| 2011/0280790 A1 | 11/2011 | Hemley | |
| 2012/0040868 A1 | 2/2012 | Hodes | |
| 2014/0150713 A1 | 6/2014 | Coe | |
| 2014/0286851 A1 | 9/2014 | Hodes | |
| 2014/0335247 A1 | 11/2014 | Cator | |
| 2015/0240381 A1 | 8/2015 | Linares et al. | |
| 2015/0259790 A1 | 9/2015 | Newman et al. | |
| 2016/0297683 A1 | 10/2016 | Newman et al. | |

FOREIGN PATENT DOCUMENTS

| | | | | |
|---|---|---|---|---|
| WO | WO 8802792 A1 * | 4/1988 | .......... | C23C 16/272 |
| WO | PCT/US2015/030963 | 5/2015 | | |

OTHER PUBLICATIONS

Maier, et al,. "Tetrakis(trimethylsilyl)tetrahedrane" J. Am. Chem. Soc. 2002 124, 13819-13826.
Maier, et al., "Tetra-tart-butyltetrahedrane" Angew. Chem. Int. E. Engl. 17 (1978) No. 7.
Maier, et al., "Tetrakis(trimethylsilyl)cyclobutadiene and Tetrakis (trimethylsilyl)tetrahedrane" Angew. Chem. Int. Ed. 2001 40, No. 9.
Eaton & Cole, "Cubane" J. Am. Chem. Soc. 86, 962-963 (1964).
Eaton & Cole, "Cubane" J. Am. Chem. Soc. 86, 3157-3158 (1964).
U.S. Appl. No. 13/204,218, filed Aug. 5, 2011. Status: Office Action received on Jun. 24, 2013. Issued as U.S. Pat. No. 8,778,295, on Jul. 15, 2014.
U.S. Appl. No. 14/120,508, filed May 28, 2014. Status: Office Action received on Dec. 16, 2014. issued as U.S. Pat. No. 9,061,917, on Jun. 23, 2015.
U.S. Appl. No. 14/713,005, filed May 15, 2015. Status: Office Action received on Sep. 8, 2015. Remains pending.
U.S. Appl. No. 14/713,043, filed May 15, 2015. Status: Office Action received on Nov. 23, 2015. Remains pending.
U.S. Appl. No. 14/934,679, filed Nov. 6, 2015. No Office Action received yet. Remains pending.
Maier, et al., "Tert-Butyl-Substituerte Cyclobutadiene Und Cyclopentadienone" Tetrahedron Letters No. 11, pp. 1025-1030, 1972.
Maier, et al., "Tetrakis(trimethylsilyl)tetrahedrane" J. Am. Chem. Soc. 2002 124, 13819-13826.
Maier, et al., "Tetra-tert-butyl tetrahearane" Angew. Chem. Int. E. Engl. 17 (1978) No. 7.
Maier, et al., "Tetrakis(trimetriylsilyl)cyclobutadiene and Tetrakis (trimethylsilyl)tetrahedrane" Angew. Chem. Int. Ed. 2001 40 No. 9.
Eaton and Cole, "Cubane" J. Am. Chem. Soc. 86, 962-963 (1964).
Eaton and Cole, "Cubane" J. Am. Chem. Soc. 86, 3157-3158 (1964).
Popov, et al., "Deposition of BCN Films by Laser Ablation", Laser Physics, vol. 8, No. 1, 1998, pp. 280-284.
Goglio, et al., "Evidence for low-compressibility carbon nitride polymorph elaborated at ambient pressure and mild temperature". Diamond & Related Materials 18 (2009) 627-631.
Wikipedia, "Heterodiamond".
Worland; See the 'Perfect' Diamond That Sold for $22 Million at Sotheby's, Time Magazine 2015.

* cited by examiner

METHODS FOR PRODUCING DIAMOND MASS AND APPARATUS THEREFOR

FIELD OF THE INVENTION

The present invention relates to methods and apparatus for performing the combinatorial synthesis of the diamond unit cell, and diamond mass therefrom.

More particularly, it relates to methods and apparatus for controllably producing three-dimensional diamond mass structures based on the combinatorial synthesis of the diamond unit cell, i.e., molecular diamond.

BACKGROUND OF THE INVENTION

Current methods for producing man-made diamond entail producing diamond either by chemical vapor deposition (CVD) or high pressure/high temperature (HP/HT) methods. CVD methods of fabricating diamond are derived from the physical methods and equipment used by the semiconductor industry. But, adapting similar or existing equipment and infrastructure does not necessarily lead to the most efficient and effective means of producing diamond films. CVD methods are inefficient because they typically rely on high temperature conditions and surface kinetics with the objective that carbon atoms will assemble into diamond or diamond-like materials. This relies on atomic motion, which can be chaotic and unpredictable. The original conception of HP/HT methods for making diamond was likely based on the brute force approach of emulating the geological processes by which diamond is produced in nature. But, nature doesn't typically produce pure diamond, much less pure diamond films that are useful industrially or commercially. Thus, current physical methods for producing diamond are inefficient and costly because they depend on surface kinetics and/or extreme process conditions for the production of diamond rather than a thermodynamically driven synthesis that could favor the specific production of molecular diamond, i.e., the diamond unit cell. Further, current methods of producing diamond also tend to be inefficient and uneconomical because they require many hours, if not days, to produce diamond films sufficiently thick to be of any practical use.

Moreover, diamond produced by current and conventional methods is typically impure, which prevents its use in many potential applications. To improve the purity of conventionally made diamond, additional processes and steps (for example, high temperature annealing), are required which is costly in terms of time and money, often making such diamond products economically unfeasible for most applications. A further limitation is that many substrate materials upon which diamond could be deposited are precluded from use because they are incompatible with the extreme conditions typically required conventional diamond-forming methods, such as high temperatures and pressures.

Current methods of diamond production are also limited because diamond deposition on the substrate cannot be controlled according to its location on a substrate. These methods typically are limited because they produce films that are essentially "sheets" of diamond that form at random in a deposition space. Thus, current methods do not disclose how to deposit diamond at a predetermined location or locations on a portion of, or in relation to, the substrate either at a planar position of the substrate or vertically upon a previously deposited diamond mass. Thus, conventional methods cannot neither provide for a controllable deposition of diamond mass three-dimensionally nor can they controllably deposit a diamond mass three-dimensionally to produce predetermined, complex shapes. Furthermore, current methods do not disclose a controlled delivery of reactants for the combinatorial synthesis of the diamond unit cell such that a diamond mass can be controllably formed to produce a predetermined three-dimensional shape at a predetermined location. In particular, they do not disclose the controlled delivery of reactants by the use of a dispenser that targets a predetermined location for deposition. They also do not teach controlling the deposition of diamond by starting, stopping, and re-starting the diamond deposition process as a means of controlling morphology. Indeed, given the relatively long time necessary for conventional methods to deposit diamond on a substrate, this would be counterintuitive and counterproductive.

Indeed, current methods for producing diamond cannot be easily adapted to the requirements and demands of widely differing applications nor can they be implemented using different apparati that are specifically designed to efficiently produce diamond-based products for specific uses. Current methods that use CVD to produce diamond films cannot produce them efficiently or quickly, and methods that rely on HP/HT approaches cannot produce bulk diamond in large quantities or in a great variety of complex shapes. In fact, no current method for producing diamond enables the production of diamond of predetermined size and/or complex shape through the use of molds into which reactants are dispensed or injected. A representative sampling of current methods and their limitations are noted below.

U.S. Pat. No. 4,849,199 discloses a method for suppressing the growth of graphite and other non-diamond carbon species during the formation of synthetic diamond. This method includes vaporizing graphite or other non-diamond carbon species with incident radiative energy that doesn't damage the substrate. Use of laser energy is also disclosed. This patent clearly evidences the major problem of contaminating graphitic impurities formed when using conventional diamond forming processes.

US 2014/0150713 discloses controlled doping of synthetic diamond material. During the disclosed diamond growth process using a CVD technique, dopant gases, including one or more of boron, silicon, sulphur, phosphorus, lithium and/or nitrogen are introduced into the plasma chamber. This patent describes that in the region where diamond is metastable compared to graphite, synthesis of diamond under CVD conditions is driven by surface kinetics and not bulk thermodynamics.

Additionally, WO8802792 discloses a process for depositing layers of diamond and describes that the reaction to deposit graphite competes with that to deposit diamond, and under many conditions graphite rather than diamond is deposited. Once deposited, the diamond is energetically favored to convert to graphite, but the reverse reaction of conversion of graphite to diamond is not thermodynamically favored.

US 2011/0280790 discloses production of large, high purity single crystal CVD diamond. Their diamond is grown using a plasma assisted chemical vapor deposition technique at growth temperatures of about 1250 to 1350° C. with growth rates of up to 200 μm/hour.

U.S. RE41,189 discloses a method of making enhanced CVD diamond. In this method, CVD diamond is heated to temperatures between 1500° C. and 2900° C. at a pressure of 4.0 GPa to prevent significant graphitization and with some improvement in the optical properties of the diamond produced.

U.S. Pat. No. 5,284,709 discloses a two-stage, plasma CVD deposition process, and the detrimental effects of structural and chemical inhomogeneities on the phonon-mediated thermal conductivity of diamond. Thus, impure, structurally non-uniform diamond is not optimally effective as a heat transfer material.

U.S. Pat. No. 5,270,077 describes the production of diamond films on convex substrates while U.S. Pat. No. 5,776,246 discloses the production of diamond films on convex or concave substrates to compensate for stress and distortions in the diamond film that can cause cracking and other imperfections.

U.S. Pat. No. 5,507,987 discloses a method of making a freestanding diamond film with reduced bowing. The method entails depositing two different layers of diamond each at different deposition rates.

U.S. Pat. No. 6,319,439 discloses a method of synthesizing diamond film without cracks which entails the use of an artificially compressive stress while decreasing the deposition temperature in a step-wise fashion.

US 2014/0335274 discloses use of a mold to define the deposition of nano-diamond particles on a substrate. This is done merely to define the placement of a nano-diamond seed solution for subsequent formation of a diamond structure, which can be accomplished, as disclosed therein, according to methods for growing diamond on a diamond seed structure as known in the art.

U.S. Pat. No. 7,037,370 discloses freestanding diamond structures and methods. The produce a diamond layer "formed by chemical vapor deposition (CVD) over the surface of a substrate that has been fabricated to form a mold defining the sub-set of intersecting facets." This patent also discloses the use of high temperature and high pressure methods.

U.S. Pat. No. 7,132,309 discloses semiconductor-on-diamond devices and methods of forming them where a mold is provided which has an interface surface configured to inversely match a configuration intended for the device surface of a diamond layer. However, only vapor deposition techniques for depositing diamond are disclosed and these techniques do not employ a chemical synthesis reaction that is thermodynamically driven to produce molecular diamond.

The diamond-based substrate for electronic devices, of U.S. Pat. No. 7,842,134 is grown by CVD on a silicon wafer.

Hence, in view of the many shortcomings of the conventional methods described above, a need remains for methods for producing diamond in a controllable manner without using diamond seeds or extreme reaction conditions of high temperature and high pressure. A need also continues to exist for methods of producing diamond that do not require one or more subsequent annealing steps to reduce impurities and imperfections in the diamond initially produced. A need also continues to exist for methods for producing diamond that allow for the controlled deposition of diamond mass in predetermined complex shapes.

SUMMARY OF THE INVENTION

Accordingly, it is an object of the present invention to provide methods for producing unit cell diamond, molecular diamond and diamond mass without using high temperatures and high pressures.

It is also an object of the present invention to provide methods for producing unit cell diamond, molecular diamond and diamond mass without using a diamond seed and without using any subsequent annealing step or steps to remove any impurities and/or imperfections.

It is, further, an object of the present invention to provide methods for producing unit cell diamond, molecular diamond and diamond mass in a controllable manner to produce predetermined complex shapes of diamond mass.

Moreover, it is an object of the present invention to provide methods for producing unit cell diamond, molecular diamond and diamond mass by combinatorial synthesis using controlled delivery of reactants which allows for starting, stopping and restarting the combinatorial synthesis as a means of controlling the morphology of the product diamond.

It is yet another object of the present invention to provide methods for producing unit cell diamond, molecular diamond and diamond mass having no impurities, such as graphitic impurities, as measured by FT-IR reflectance spectroscopy. This eliminates the need for any costly subsequent process steps, such as annealing, to remove impurities in the product diamond.

It is still another object of the present invention to provide methods for producing unit cell diamond, molecular diamond and diamond mass driven thermodynamically rather than kinetically.

It is yet another object of the present invention to provide methods for producing unit cell diamond, molecular diamond and diamond mass at a growth rate limited only by the speed at which the reactants can be brought together.

Further, it is an object of the present invention to provide an apparatus for preparing the unit diamond cell, molecular diamond and diamond mass.

DETAILED DESCRIPTION OF THE PREFERRED EMBODIMENTS

Figure 1:
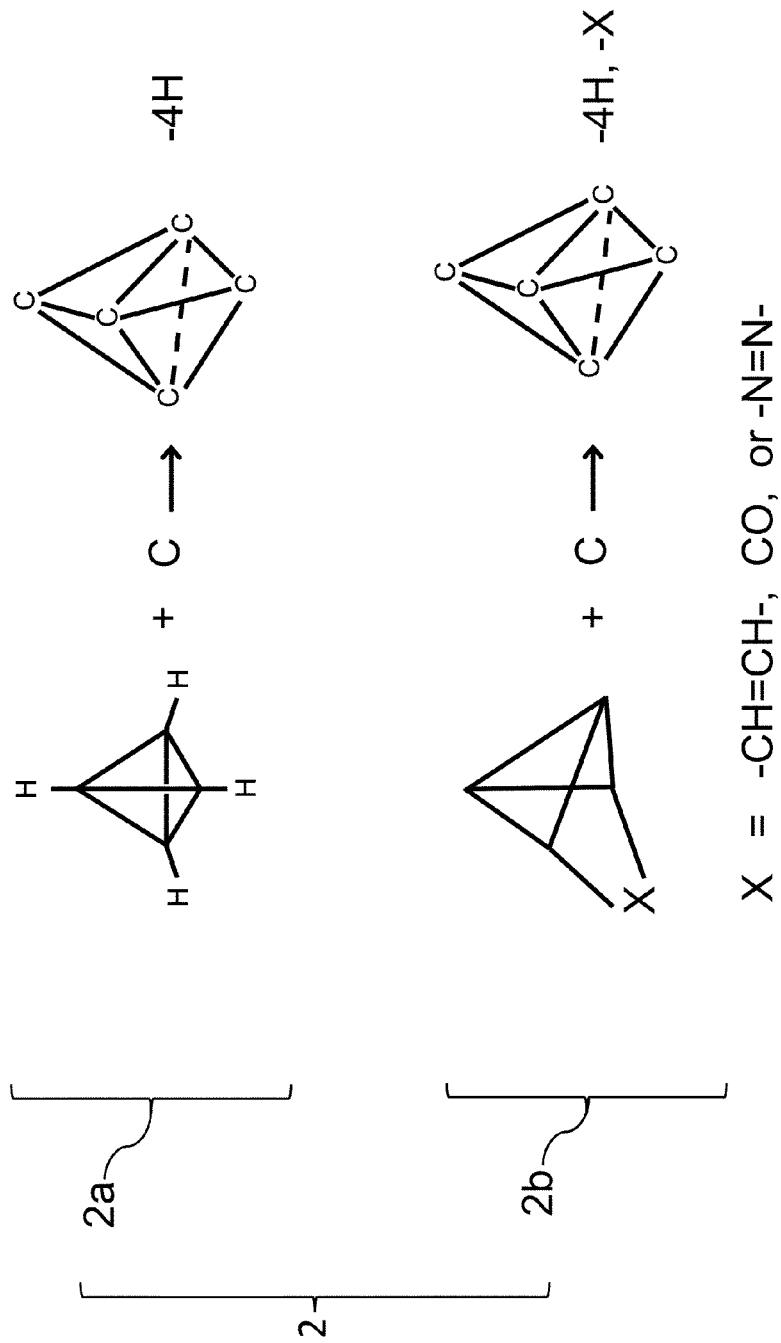
FIG. 1 illustrates the molecular diamond forming reactions of the present invention.

U.S. Ser. No. 14/120,508, filed on May 28, 2014, now allowed; and U.S. Ser. No. 13/204,218, now U.S. Pat. No. 8,778,295, are both incorporated herein by reference in their entirety.

Term Definitions:

Diamond unit cell: means a molecular structure as exemplified by the two-dimensional drawing shown further below in this specification that ultimately leads to the production of diamond mass. In the present invention, the diamond unit cell is produced by a combinatorial synthesis in reacting a tetrahedranoidal compound with a carbon atom. The diamond unit cell is formed in situ in this reaction.

Diamond mass: means the resultant accumulation of diamond resulting from serial, continuous or concomitant depositions of diamond unit cell to a surface, generally, or substrate, specifically.

Predetermined: means a design or shape determined previously to the actual production of diamond unit cell and diamond mass based upon a desired configuration suited for a particular use.

Combinatorial Synthesis: means the reaction of a tetrahedranoidal compound with a carbon atom to produce the diamond unit cell.

Shapeable: means fabricable or shaped by deliberate design during the combinatorial synthesis reaction to produce diamond unit cell, and then diamond mass. Thus, by virtue of the present invention diamond unit cell and diamond mass are depositable on substrates of varying shape, such as convex, concave, and ellipsoid as well as other three-dimensional shapes and of varying thickness as required for various end uses of the deposited diamond mass. Hence, this process is controllable to meet desired design specifications. Thus, for example, one exemplary definition of shapeable as used herein is to be rendered shapeable by a series of programmed deposition events as described in the present specification for a detailed description of FIGS. 6 and 8. Shapeable also refers to shapeable in terms of molds, nozzles and by dispensing, i.e., deposition by targeting a controlled amount of reactants at particular locations on a surface, generally, or on a substrate, specifically.

Inert gas or gases: means any one or combination of the noble gases, except radon. Thus, the term inert gas or gases includes helium, neon, argon, krypton and xenon. Generally, argon is used as it is less expensive than the other noble gases.

Vacuum and Pressure: generally means a range of from about 0.5 atmospheres (vacuum) to about 2 atmospheres (pressure). Preferably, this ranges from about 0.75 to about 1.25 atmospheres. Most often, atmospheric pressure is used.

No Diamond Seed: means that the present invention uses no extrinsic or extraneously-planted diamond seed to induce diamond formation. Rather, the present invention forms diamond unit cell in situ by combinatorial synthesis and then, in the aggregate, diamond mass without the use of any extrinsic diamond seed to induce diamond formation. The diamond unit cell formed in situ is not an extrinsically added diamond seed.

Molecular diamond: as used herein means the diamond unit cell.

The present invention provides diamond products that are produced with a quality and form that are impossible to achieve using conventional technologies. To date, conventional diamond technologies have been incapable of consistently producing a wide array of diamond products both economically and in industrial quantities. Further, conventional diamond-producing methods have proved unable to reliably produce ultra-pure, macroscopic, three-dimensional diamond articles of arbitrary, predetermined shape without complicated post-processing steps. Additionally, conventional methods of producing diamond are limited by their reliance on high temperature CVD processes or high-pressure/high-temperature (HP/HT) techniques, which precludes the use of deposition substrates that would be destroyed by such extreme process conditions. Unfortunately, the tremendous technological potential for the use of diamond as a material for a vast number of applications has yet to be realized because of the limitations of conventional diamond-producing methods. The present invention represents an advance in the art that answers the heretofore unmet need for diamond production methods that yield high quality diamond materials in quantities that are reasonable in cost.

One object of the present invention is produce molecular diamond (i.e., the diamond unit cell) by implementing the reaction between a tetrahedranoidal compound and a carbon atom. A further object of the invention is to produce a diamond mass by depositing molecular diamond on a substrate using the combinatorial synthesis of the diamond unit cell at temperatures that are significantly lower than related art methods.

Another object of the invention is to produce molecular diamond that is ultra-pure, i.e., substantially free of graphitic and other impurities that in significant quantity would impair the use of the diamond in semiconductor and related applications. A still further object of the invention is to deposit molecular diamond on substrates that would otherwise be destroyed by the extreme temperatures currently used in CVD and high-pressure/high-temperature methods of making diamond. An additional object of the present invention is to controllably fabricate three-dimensional molecular diamond structures of predetermined shape. Yet another object of the present invention is to mold macroscopic structures of molecular diamond. A yet further object of the invention is to provide an apparatus that controllably builds three dimensional molecular diamond masses of predetermined morphology by providing for the necessary conditions for the combinatorial synthesis of molecular diamond (i.e., the diamond unit cell). Still another object of the invention is to provide an apparatus that renders a diamond mass shapeable according to predetermined morphology.

In one embodiment, these objects and more are achieved in a reaction chamber by providing a source of tetrahedranoidal molecules as a reactant, providing a source of carbon atoms as another reactant, reacting the two reactants to form molecular diamond deposited on a substrate. In the vapor phase, this reaction is performed in the presence of one or more carrier gases. Although the molecular diamond forming method of the present invention can be performed in the vapor phase, this process is different from the chemical vapor deposition (CVD) methods of the related art for forming diamond. The present invention produces diamond at the molecular level, that is, by forming the diamond unit cell, the fundamental unit of diamond that is made up of five carbon atoms. It starts with a reactant whose structure is close to that of the diamond molecule and, with the addition of a single carbon atom, thermodynamically becomes diamond. This is in contrast to related art CVD methods that rely on directly applying high energy to carbon atoms with the precarious expectation that these atoms will form a diamond film, but it is usually by an inefficient and expensive process that yields less than pure product. In the solid state, this reaction of the present invention is performed by evaporating a homogeneous solution of the reactants to yield a homogeneous solid mixture of the reactants, and then exposing the reactant mixture to a bond-cleaving, high energy discharge, thus releasing carbon atoms from the carbon source and causing molecular diamond to form. The reaction chamber includes inlet ports and at least one effluent port, temperature control means, flow control means, effluent monitoring means, and a system controller for receiving measured parameters and adjusting controls to optimize molecular diamond formation. The system controller includes a software program.

In another embodiment, an apparatus is provided to produce molecular diamond, i.e., diamond mass that is produced from the diamond unit cell in the vapor phase. The apparatus includes a reaction chamber with at least one work piece holder for holding a deposition substrate, an effluent port remote from the substrate, a monitor for monitoring the chemical composition of the effluent, a means for controlling the deposition substrate temperature, a means for controllably evaporating a tetrahedranoidal compound in a flow of inert carrier gas, a means for directing the flow of the tetrahedranoidal compound in the inert carrier gas to the vicinity of the deposition substrate, a means for controllably providing carbon atoms in an inert carrier gas, a conduit adapted to convey the carbon atoms into the flow of the tetrahedranoidal compound in the inert carrier gas in the vicinity of the deposition substrate, a means for diverting the inert carrier gases with the tetrahedranoidal compound and the carbon atoms, and a system controller. In addition the reaction chamber may have a means for controlling the pressure within the reaction zone.

In yet another embodiment, an apparatus is provided to produce a diamond mass from molecular diamond (i.e., the diamond unit cell) that is produced in the solid state. The apparatus includes a reaction chamber, a means for introducing an inert gas into the reaction chamber, at least one work piece holder in the reaction chamber for holding a deposition substrate, a reservoir for holding a homogeneous reactant solution of a tretrahedranoidal compound and a carbon source compound, a reactant dispenser in the reaction chamber for dispensing the homogeneous reactant solution, the dispenser being movable in three-dimensions to a predetermined location in the reaction chamber, a conduit for conveying said homogeneous reactant solution from the reservoir to the dispenser, a means for controlling the temperature of a deposition substrate, an effluent port disposed in the reaction chamber remote from the at least one work piece holder, a monitoring means for monitoring effluent content, a switchable high energy discharge means for cleaving bonds of the carbon source compound thereby releasing carbon atoms, a system controller for controlling pressure within the reaction chamber, flow of the reactant solution to the dispenser, relative position of the dispenser with respect to a deposition substrate, dispensing of the homogeneous reactant solution, activation of the switchable high energy discharge means, timing of the process sequence, wherein the monitor provides information governing timing of the reaction process and the sequences thereof. In addition the reaction chamber may have a means for controlling the pressure within the reaction zone.

Diamond is the allotrope of carbon whose crystal unit cell (the smallest unit of atoms that constitute the crystalline form of carbon known as diamond) is a 5-membered tetrahedron having 4 carbon atoms occupying the apices of the tetrahedron and a fifth carbon atom located centrally within the tetrahedron (the "cage" position). This $C_5$ tetrahedron is the "building block" for all diamond masses made therefrom. The carbon-carbon bond lengths, strengths, and bond angles are the same for all carbon atoms that comprise the diamond unit cell. They are short, strong, $sp^3$ hybridized bonds.

Two Dimensional Representation of the Diamond Unit Cell.

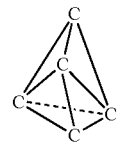

The syntheses of the diamond unit cell (and the resulting diamond masses so produced therefrom) can occur in the vapor phase or the solid state. They proceed by a combinatorial reaction. That is, a first species reacts with a second species to produce a product that is the diamond unit cell. The first reactive species is a carbon atom. The second reactive species is either a tetrahedral hydrocarbon molecule or tetrahedranoidal molecule. Indeed, tetrahedrane itself is a tetrahedranoidal molecule. In the case of U.S. Pat. No. 8,778,295, atomic carbon atom reacts with a transient intermediate produced by the catalytic treatment of acetylene in the vapor phase to form the diamond unit cell with concomitant ejection of hydrogen. The diamond unit cell deposits onto a deposition substrate from the vapor phase. We believe that the product of acetylene catalysis is tetrahedrane. Tetrahedrane has never been observed or isolated, but the results of the reaction disclosed in U.S. Pat. No. 8,778, 295 strongly suggest that tetrahedrane is the reactant that produces diamond by reacting with a carbon atom.

Diamond Unit Cell Synthesis of U.S. Pat. No. 8,778,295

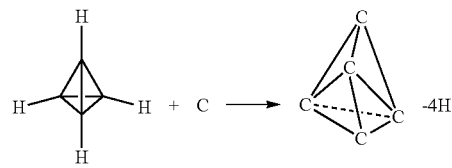

One skilled in the art may review U.S. Pat. No. 8,778,295, for a more detailed understanding of the synthesis of the diamond unit cell by this method.

The vapor phase synthesis of diamond disclosed in US2014/0286851 proceeds by a related combinatorial synthesis wherein a carbon atom reacts with a tetrahedranoidal molecule with concomitant ejection of hydrogen and a "leaving group" to form the diamond unit cell, which deposits from the vapor phase onto a deposition substrate.

The tetrahedranoidal molecules that may be used are, benzvalene or 2,3,4-methynylcyclobutanone (non-IUPAC naming for clarity) or any other tetrahedranoidal molecule having a stabilizing species inserted into the C—C bond. Benzvalene and 2,3,4-methynylcyclobutanone are tetrahedranoidal molecules that are stable and isolable compounds. Structurally, they are tetrahedranes having a species "inserted" between two carbon atoms in place of a direct C—C bond. It is this "insert species" that is the "leaving group" of this vapor phase diamond unit cell synthesis. One of ordinary skill in the art will understand that any tetrahedranoidal molecule having sufficient stability and vapor pressure may be used in the diamond forming reaction of the present invention. For example, various bicyclobutane compounds may be used. Their synthesis is known. See Journal of the American Chemical Society, 89:17, Aug. 16, 1967. Tetrahedrane, itself, is a tetrahedranoidal molecule or compound, and, as such, falls within the definition of "tetrahedranoidal compound" as used herein in accordance with the present invention.

In the case of benzvalene, the "insert species" is —HC=CH— (ethylene). In the case of 2,3,4-methynylcyclobutanone, the "insert species" is CO.

Benzvalene ($C_6H_6$) bp=77.558° C. (760 mm Hg) vapor pressure 106.123 mm Hg at 25° C.

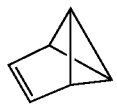

2,3,4-methynyl-cyclobutanone ("Tetrahedranone", "Carbonyl tetrahedrane", $C_5H_4O$) bp=~37° C. (some decomposition).

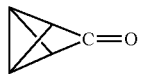

Stable, isolable tetrahedranes are known, but they bear sterically bulky substituents on reactants for the diamond unit cell forming reactions of either disclosure.

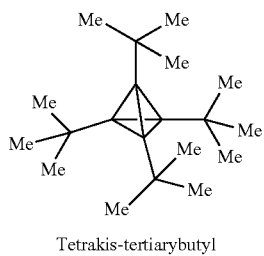

Tetrakis-tertiarybutyl tetrahedrane

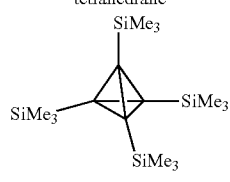

Tetrakis-trimethylsilyl tetrahedrane

A solid-state diamond unit cell forming reaction is also disclosed in US 2014/0286851. In this reaction, a homogeneous mixture of cubane and tetrandranoidal molecule having a tetrahedranoidal molecule-to-cubane (molar) ratio optimally of 8:1 is subjected to a high energy discharge for a time sufficient for completion of the formation of a diamond mass comprising diamond unit cells. Both benzvalene and 2,3,4-methynylcyclobutanone may be used as the tetrahedranoidal molecule, and 3,4-diazabenzvalene may also be used as the tetrahedranoidal molecule (3,4,5-methynyl-dihydro-1,2-pyrazole, $C_4H_4N_2$; decomposes at about −60° C.).

The diamond unit cell forming reaction of US 2014/0286851 occurs as follows.

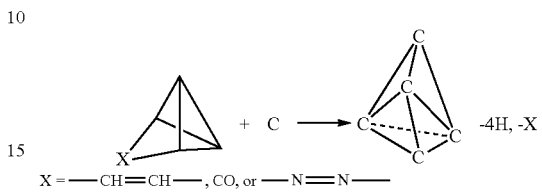

A plurality of diamond unit cells so formed assemble to form a diamond mass. Thus, the diamond mass is formed by the assembly of a plurality of diamond unit cells, i.e., diamond molecules.

The role of cubane is the same for both disclosures (U.S. Pat. No. 8,778,295; US 2014/0296851) in both the vapor phase and solid-state diamond unit cell forming reactions. Cubane is a source of atomic carbon as it can be decomposed cleanly to carbon atoms and hydrogen by a high energy discharge (e.g., microwave, but not limited to microwaves) without the complications of meta-stable radical impurities that would defeat the disclosed diamond unit cell forming reactions. Cubane is stable and can be evaporated such that, through multiple sublimations, it can be made to have very high purity. Cubane has 166 kcal/mole of strain energy due to its 90° bond carbon-carbon bond angles, which likely explains its advantageous use as a source of carbon atoms. It is uncomplicated by the meta-stable radical impurities typically encountered with other prior art carbon sources used in non-unit cell diamond syntheses. For example, methane, the most commonly employed carbon source produces methyl radicals, di-radical methylene, and tri-radical methyne species under thermal or electromagnetic energy decomposition methods.

The following shows the decomposition of cubane and thus its use as a carbon source.

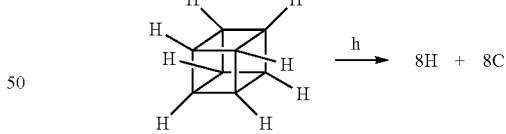

To obtain a mass of high purity diamond suitable for optical and semiconductor applications, the materials scientist will recognize that this method of diamond synthesis does not use the energy of the deposition substrate as part of the diamond unit cell forming reaction. This allows substrate materials, which could never survive the rigorous conditions of prior art diamond syntheses, to be used as deposition substrates. It also allows the use of production apparatus that would fail under prior art syntheses conditions.

The disclosed unit cell synthesis does not proceed by the assembly of carbon atoms (i.e., atomic motion on a surface) to form diamond. The result is that graphitic and amorphous carbon impurities typically observed for diamond produced by HPHT methods are not found in diamond masses produced by diamond unit cell syntheses. Non-stoichiometric C—H impurities within the diamond lattice typical of prior art CVD diamond syntheses are also not observed in diamond masses produced by diamond unit cell syntheses because the carbon atom source (cubane) does not produce the C—H impurities that complicate CVD diamond produced from hydrocarbons such as methane. The rate of diamond formation for diamond unit cell syntheses is very fast compared to prior art high pressure/high temperature (HPHT) and chemical vapor deposition (CVD) diamond methods. The rate of diamond formation does not rely upon assembly of carbon atoms to form a diamond mass as is the case in diamond produced by prior art CVD methods. Rather, it is solely dependent upon chemical kinetics—the rate at which the reactants can be provided and combine to produce the diamond unit cell. Thus, the speed of formation of a diamond mass using the present invention is a function of the rate at which reactants can be provided. On the other hand, the chemical reaction per se of a tetrahedranoidal compound with a carbon atom is both thermodynamically driven and entropically driven. In the diamond forming process disclosed in U.S. Pat. No. 8,778,295, a carbon atom reacts with what we believe is tetrahedrane (an acetylene-derived, catalytically produced intermediate), producing one unit cell and four hydrogen atoms. Disorder increases from two to five, a net entropy change of three. Furthermore, diamond is thermodynamically stable while tetrahedrane is most definitely not. It is highly unusual and, indeed, surprising to have any chemical transformation that is favored both by entropy (increase in disorder) and thermodynamics. In the diamond forming process of US 2014/0286851, a carbon atom reacts with a tetrahedranoidal compound, for example, benzvalene. Diamond forms along with four hydrogen atoms and one ejection product or "leaving group," which is HC≡CH (acetylene). This results in the two reactants producing one diamond unit cell, four hydrogen atoms, and one acetylene. Two goes to six, a net entropy change of four. Thus, in the reactions of both disclosures, the products are at a higher state of entropy than the reactants.

In "Chemthermo: A Statistical Approach to Classical Thermodynamics" (1972), by Leonard Nash, an example is provided regarding the conventional geologic conversion of graphite to diamond from a Gibbs "free energy" perspective. First, the mere fact that the density of diamond is 3.5 gm/ml, and that of graphite is 2.25 gm/ml, alone, suggests that an enormous amount of pressure is involved in the natural process of converting graphite to diamond. Second, Nash calculates an equilibrium pressure between graphite and diamond formation to be 75,000 atm. at 1,500° K. This translates to a depth of over 400 miles deep in the earth at a temperature of about 2240 degrees ° F. Any higher pressure and/or temperatures above these points increasingly thermodynamically favor diamond production. Additionally, as already noted in US 2014/0150713, ". . . in the region where diamond is metastable compared to graphite, synthesis of diamond under CVD conditions is driven by surface kinetics and not bulk thermodynamics." Thus, it is unsurprising that many prior art processes for producing diamond rely either on high temperatures (in CVD processes) and high pressures and temperatures in other processes. It might be said that developers of CVD and HP/HT processes for making diamond intuitively attempt to emulate Nature. But Nature doesn't make high purity diamond, much less high purity diamond films suitable for semiconductor, optical, and other technological applications. Thus, in view of current diamond synthesis technologies, it may appear surprising and counterintuitive to one with ordinary skill in the art that it is possible to produce a diamond mass at ambient and even very low temperatures. Furthermore, it may also appear surprising to the practitioner of the prior art that present invention's disclosed reactions can also be performed at atmospheric pressure. In contrast to prior art diamond syntheses, which require the imposition of high temperature, the reactions of the present invention are driven by the chemical bond energies of the reactants.

In the present invention, product purity is controlled by stoichiometry, that is, sufficient excesses of tetrahedrane or tetrahedranoidal reactants are provided to consume all the carbon atoms produced. The purity of the diamond product obtained by the disclosed diamond unit cell syntheses is also a consequence of the purity of the reactants, and this is readily maintained at research purity by using standard chemical purification techniques well known to those with ordinary skill in the art of chemical synthesis.

Diamond unit cell synthesis provides the materials scientist with a consistent and reliable source of high purity diamond that is extremely difficult to obtain by other diamond syntheses. It also produces diamond masses much faster than other diamond syntheses, and this is an economic advantage of the present invention. The diamond unit cell synthesis may also provide the materials scientist with a form of diamond heretofore unavailable by other diamond syntheses. Specifically, replacement of atomic carbon with a heteroatom can produce a diamond homologue having a heteroatom inserted into the cage position of the diamond unit cell rather than a carbon atom. The heteroatoms suitable for preparing a hetero-diamond homologue include nitrogen (from ammonia or hydrazine) and boron (from borane or diborane) as they have the appropriate bond order capability (4) and atomic size for insertion into tetrahedrane or a tetrahedranoidal molecule to form a hetero-diamond unit cell. Such a hetero-diamond species, for example, would be an electret because it would bear a charge without a countercharge. This may introduce the possible use of hetero-diamond as a highly electrically conductive material at room temperature because, at room temperature, diamond displays a very low RMS vibration (0.002 nm).

Diamond has many desirable properties. Due to the short, strong, and uniform bond lengths, strengths, and angles of the diamond unit cell, diamond has a hardness of 10 on the Mohs scale, the hardest material known. It has exceptional chemical stability, igniting in air at about 1000° C. and in pure oxygen at about 700° C.

These properties account for diamond's use in a wide variety of cutting and abrading applications. The high room temperature thermal conductivity of diamond, about 2,000 W/mK, and its low coefficient of friction, 0.05-0.08 make diamond a particularly useful material for bearings and other tribological applications. By comparison, tungsten carbide has a coefficient of friction of about 0.2-0.25 under the same conditions. Due to its relative ease and economy of preparation, polycrystalline diamond is frequently employed as a bearing surface. Applications that exploit these mechanical properties of diamond (cutting abrading, and low friction surfaces (bearings, coatings for mammalian joint replacement devices, etc.), do not require high levels of purity.

Diamond has a high index of refraction (2.4), and optical transparency from infrared through visible wavelengths. UV fluorescence observed for diamond attributed to flaws is used by gemologists in sorting and grading naturally occurring diamonds and to separate mineral diamond from impurities such as garnet. Diamond has been found to be both x-ray fluorescent and x-ray transmissive. When pure or dopant free, it may be used in place of beryllium as an x-ray window. However, diamond has also been observed to fluoresce green upon exposure to x-rays. This fluorescence has been attributed to impurities or dopants as well as flaws in naturally occurring diamond, a property also exploited by gemologists in grading and sorting of diamonds. A band gap of 5.45-5.47 eV renders diamond a superb electrical insulator ($10^{16}$ ohm). Boron doped (blue) diamond has been found to be p-type semiconductor having a high hole mobility and electrical breakdown strength. These properties make diamond highly desirable as a material for applications including, but not limited to, semiconductor devices, optoelectronic devices, directed energy device windows and lenses, optical devices such as windows, prisms, mirrors, and lenses, and electromagnetic shielding. The combination of high thermal conductivity and high electrical resistivity available in diamond of very high purity makes it attractive as a semiconductor substrate. Exploitation of such properties of diamond as a material in these applications requires that diamond be ultra-pure-far beyond the purity requirements for diamond in cutting, milling, low friction surface applications, and gemstones. For example, it is estimated that diamond requires an impurity level less than 100 parts per million if it is to be used as a semiconductor, with an impurity level of less than 10 ppm being most desirable. Optical use, particularly for directed energy device (e.g., lasers) windows and lenses also requires similar low impurity levels as do optoelectronic device applications. Thus, a need exists for synthetic diamond products produced using a process that yields extremely high purity, or ultra-pure, diamond. There is also a need for synthetic diamond products produced using a process that can be performed at low temperatures. Such a process allows the use of substrates, shapes, and forms made from materials that would be destroyed at the high temperatures typically associated with synthetic diamond producing processes of the related art. This process would allow the use of substrates, molds, and forms made from materials that can be more easily worked, are less expensive, and from which a diamond mass can be more easily removed than previous methods of producing synthetic diamond. There is yet another need for synthetic diamond products that can be shaped during the production process. Current processes of the related art typically produce a single layer or coating of synthetic diamond on a substrate surface and cannot be used to produce diamond masses with a variety of predetermined shapes. That is, while current processes may produce a diamond product that reflects the shape of its deposition substrate, these diamond products are not shapeable upon the substrate according to a predetermined morphology. Furthermore, current processes are typically incompatible with the use of molds that confer a predetermined, three-dimensional shape to a diamond mass. Typical diamond processes such as CVD and HP/HT methods cannot deposit diamond mass material on selected portions of a substrate through the use of nozzles or other reactant conduits that direct and focus combined streams of reactants at a specific target area of the substrate. There is similarly a need for a diamond synthesis process that can produce a diamond mass with a predetermined, three-dimensional shape. There is also a need for synthetic diamond products that are produced by a process that yields a diamond mass quickly and efficiently enough to be economically beneficial for mass production. Thus, there is a need for a synthetic process for producing a diamond mass that grows at around a millimeter of thickness per hour or faster. There is a further need for extremely pure synthetic diamond products produced using a process that is controllable in terms of such parameters as reactant delivery, reactant purity, effluent flow, product purity, product shape, crystal morphology, and dopant or impurity content. Multiple controllable parameters in the needed processes allow for the use of automatic control methods that currently use microcontroller means including microcomputers, sensors, and various actuators known in the art. These processes should be controllable in three-dimensions. Furthermore, there is a need for a synthetic diamond mass producing process that is thermodynamically driven, the speed of which reaction is primarily dependent upon the speed at which reactants can be provided, as opposed to a process that depends primarily upon surface kinetics.

The present invention uses the diamond unit cell combinatorial reactions disclosed in detail in U.S. Pat. No. 8,778,295 and US 2014/0286851, which are incorporated herein by reference. Two vapor phase reactions are disclosed, both of which require a carbon atom source that reacts with a tetrahedranoidal compound to form molecular diamond. One method uses what is believed to be tetrahedrane, produced by the catalytic dimerization of acetylene as the tetrahedranoidal reactant. The other vapor phase reaction uses other tetrahedranoidal compounds (e.g., benzvalene, 2,3,4-methynyl-cyclobutanone, etc.) such as have been discussed above. When a stoichiometric excess of these compounds is reacted with the carbon atoms provided, for example, from cubane that has been radiated with an energy source such as microwaves, diamond unit cells (i.e., molecular diamond) are formed that then combine to yield a diamond mass. A solid-state reaction that yields a diamond mass is disclosed in detail in US 2014/0286851.

FIGS. 1-8 will be described below in more detail.

FIG. 1 illustrates the two diamond unit cell combinatorial reactions disclosed in detail in U.S. Pat. No. 8,778,295 and US 2014/0286851. In reaction 2a, disclosed in detail in U.S. Pat. No. 8,778,295, what we believe to be tetrahedrane reacts with a carbon atom to yield the five-carbon diamond unit cell with concomitant ejection of four hydrogen atoms. In this reaction, the tetrahedrane is produced by the catalytic dimerization of acetylene. The carbon source can be cubane that, when exposed to a high-energy discharge (e.g., microwave, RF, plasma, etc.), yields eight carbon atoms and 8 hydrogen atoms (a propitious carbon to hydrogen ratio of 1:1). In reaction 2b, disclosed in detail in US 2014/0286851, a tetrahedranoidal molecule is reacted with a carbon atom to yield the five-carbon diamond unit cell with concomitant ejection of four hydrogen atoms and a C—C bond insert species (a leaving group). This reaction can be conducted in either the vapor phase or solid state. The carbon source can be cubane that, when exposed to a high-energy discharge that can be switched on and off (e.g., microwave, laser, RF, plasma, etc.) yields eight carbon atoms and eight hydrogen atoms (a propitious carbon to hydrogen ratio of 1:1). A leaving group, X, is also a product of the reaction. The leaving group, X, can be, for example (but not meant to be limited to), —CH═CH—, CO, or —N═N—. Benzvalene can be used as the tetrahedranoidal molecule, in which case the leaving group will be —CH═CH—. Tetrahedrane, itself, is a tetrahedranoidal molecule. Reactions 2a and 2b can be generally designated as reaction 2, which, for the purposes of the present invention, indicates either the use of reaction 2a or 2b.

Figure 2:
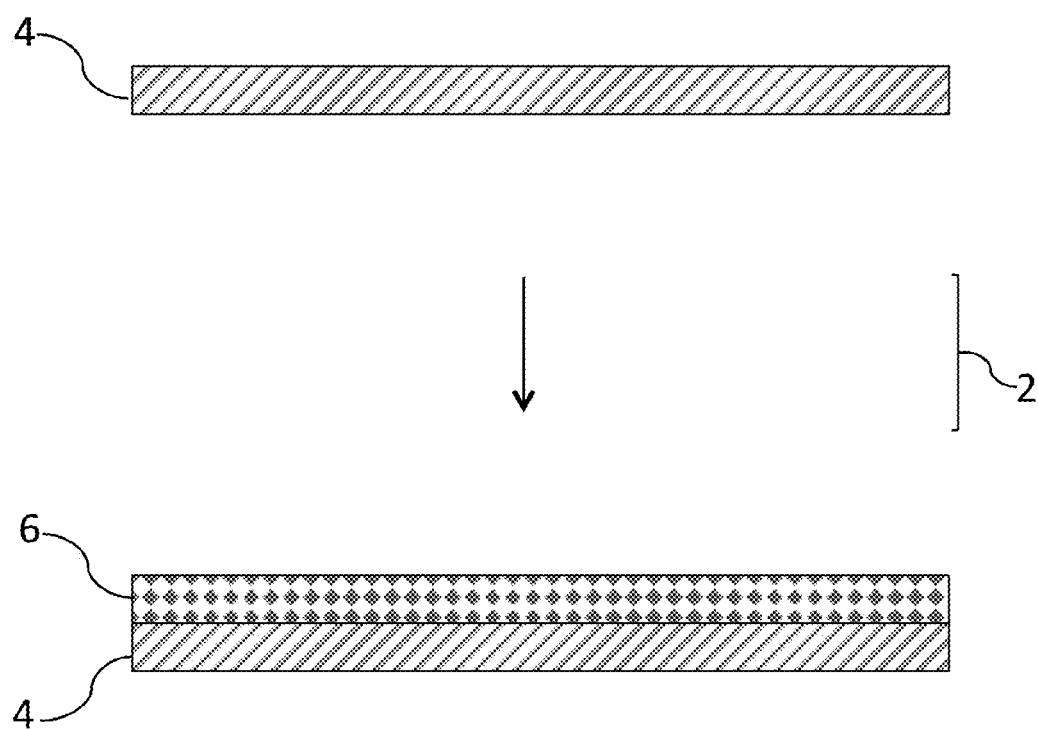
FIG. 2 is a cross-sectional drawing which shows the deposition of a molecular diamond mass using the combinatorial synthesis reactions of the present invention.

FIG. 2 is a schematic representation in cross section of one use of the combinatorial reactions disclosed in U.S. Pat. No. 8,778,295 and US 2014/0286851. This involves the reactions 2 of either what is believed to be tetrahedrane (reaction 2a) or a tetrahedranoidal molecule (reaction 2b) with a carbon atom to yield the five-carbon diamond unit cell structure, which is a tetrahedron with a carbon at each apex and a carbon in the middle "cage" position. During this reaction there is a concomitant ejection of four hydrogen atoms. In the particular reaction disclosed in U.S. Pat. No. 8,778,295, tetrahedrane is a transient intermediate species that is believed to result from the catalysis of acetylene, and the specific details for producing tetrahedrane are disclosed in this patent. In this reaction, tetrahedrane reacts with a carbon source such as cubane that has been subject to a high-energy discharge that can be controllably switched on and off (microwave, laser, RF, plasma, etc.). In the particular reaction disclosed in US 2014/0286851, a tetrahedranoidal compound (e.g., benzvalene, tetrahedranone, etc.) reacts with a carbon source, such as cubane that has been subject to a high-energy discharge (e.g., microwave, laser, RF, plasma, etc.). Substrate 4, shown as a cross section of a flat disk or wafer, is placed in a reaction chamber (not shown) such that, in the presence of the disclosed reactants, diamond unit cells deposit thereupon to form a diamond mass 6 comprising an assembly of diamond molecules. When the reaction disclosed in U.S. Pat. No. 8,778,295 is used, a catalyst (not shown) is placed in close proximity to the substrate (~5 mm or closer) due to the transient nature of tetrahedrane. When the reactions (2b) disclosed in US 2014/0286851 are used, either the vapor phase or the solid-state reaction can cause a diamond mass 6 to be deposited onto the substrate 4. The reactions 2b do not require a catalyst.

For the vapor phase reaction, precise stoichiometry is not required. Rather, an excess of tetrahedranoidal compound is favored. That is, a tetrahedranoidal compound-to-cubane of ratio equal to or greater than 8:1 is used. Optimally, the ratio is 16:1 (or greater) to ensure that all atomic carbon is reacted in the vapor phase to precipitate the diamond unit cell onto the substrate. The tetrahedranoidal compounds that may be used for this are benzvalene and 2,3,4-methynyl-cyclobutanone ("tetrahedranone"). Benzvalene is advantageous over tetrahedranone because it is more stable and more readily and economically obtained. The impurity due to autogenous decomposition for benzvalene is benzene while the impurity obtained by autogenous decomposition of tetrahedranone is dicyclobutadiene, which is far more difficult to maintain in the vapor phase than benzene. Benzene can introduce graphitic impurities into diamond obtained by its deposition during the diamond unit cell forming reaction if allowed to come into contact with the deposition substrate. Benzene, if it is present, can be prevented from contaminating the diamond deposited upon the substrate by the diamond unit cell forming reaction (vapor phase) by two means. First, one need only heat the substrate holder (hence the substrate) to about 80-85° C. transferring sufficient heat to the vapor phase reaction zone vicinal the deposition substrate to "drive off" any benzene that may be present. Alternatively, a second flow of heated carrier gas may be provided along the surface of the deposition substrate to maintain a "thermal barrier zone" against benzene if it is present. Such measures against benzene contamination may not necessarily be needed if benzvalene is properly handled, particularly during its vaporization. Thus, if rapid heating of benzvalene to its vaporization temperature is avoided, benzene formation can be avoided.

The substrate 4 of FIG. 2 need not be shaped as shown. It can be of any predetermined shape provided that the deposition surface is exposed in sufficient proximity to reaction 2 to allow formation of the diamond mass. When using the reaction 2a of U.S. Pat. No. 8,778,295, the substrate must be in sufficient proximity to the catalyst as has been disclosed. The stoichiometry of the combinatorial reactions requires that there be an excess of the tetrahedrane (reaction 2a) or tetrahedranoidal molecules (reaction 2b) compared to carbon atoms (e.g., those derived from cubane that has been subject to a high-energy discharge). Thus, the predetermined shape of the substrate must allow for adequate exposure of its surface or surfaces to the reaction 2. It is important that its placement in the reaction chamber (not shown) be within a region where the necessary stoichiometry is maintained.

The purpose of the embodiment of FIG. 2 is to deposit a diamond mass on a substrate. The substrate can either function integrally in cooperation with the diamond mass or it can serve simply as a support for forming the diamond mass. Examples of products that include a diamond mass deposited on a substrate include, but are in no way limited to integrated circuits, discrete transistors or other electronic components, lenses, watch crystals, windows, displays (e.g., those of "smart" phones, computers, televisions, etc.), optical fibers and other optical waveguides, optical couplers, photosensors, photovoltaic cells, tribological devices (e.g., bearings, bearing tracks, skates, skis, sled runners etc.), implantable medical devices, gears, cooking utensils (e.g., "non-stick" pans, knives, etc.), cutting or boring elements (e.g., knives, scalpel/surgical blades, razor blades, saws, drill bits, borers, etc.), conformal coatings, microelectromechanical systems (e.g., integrated accelerometers), piezoelectric devices (surface acoustic wave devices, resonators, etc.), ornamental objects (gems, crystal glass, jewels, etc.), and others.

Once the diamond mass 6 of FIG. 2 has been deposited on substrate 4, further processing can be performed to modify the three dimensional shape and function of the diamond mass/substrate combination. As but one example, photolithography can be performed in the same or analogous ways it is done in the well-established art of integrated circuit or micro-electromechanical systems (MEMS) fabrication. Diamond films can be patterned and etched using, for example, hard masks of $SiO_2$ and reactive ion etching/inductive coupled plasma or oxygen-plasma. Through the use of photolithography and related techniques, at least a portion of the diamond mass is removed from the substrate. However, the diamond mass may be removed entirely, for example, if it were to be used as mask, itself. Furthermore, the substrate 4 need not comprise solely a single material. Rather, it can be a complex functional structure that might include, for example, metal traces and pads, dielectric materials (e.g., $SiO_2$), and semiconductor materials (e.g. doped and undoped silicon), etc. Substrate 4 may be an adhesion layer between another material and the diamond mass 6. Examples of such adhesion layers may be, but are not limited to, materials such as silicon nitride, silicon carbide, aluminum nitride, silicon, and the like.

By photolithography and related techniques is meant photolithography, electron beam photolithography or ion beam photolithography. For example, any type of lithography may be used, such as lens array photolithography (U.S. Pat. No. 6,016,185), semiconductor nano-sized particle-based photolithography (US 2011/0281221) and photolithic systems using a solid state light source (US 2012/0170014), all of which U.S. patents are incorporated herein by reference in the entirety.

Any electron beam photolithographic technique may also be used. For example, the electron bean may be simple (U.S. Pat. No. 5,767,521), multiple beam (U.S. Pat. No. 6,429, 443) or parallel multi-electron beam (U.S. Pat. No. 7,075,093), all of which U.S. patents are incorporated herein by reference in the entirety.

Furthermore, any ion beam photolithographic technique may be used. For example, a masked ion beam (U.S. Pat. No. 4,757,208) may be used, which U.S. patent is also incorporated herein by reference in the entirety.

Figure 3:
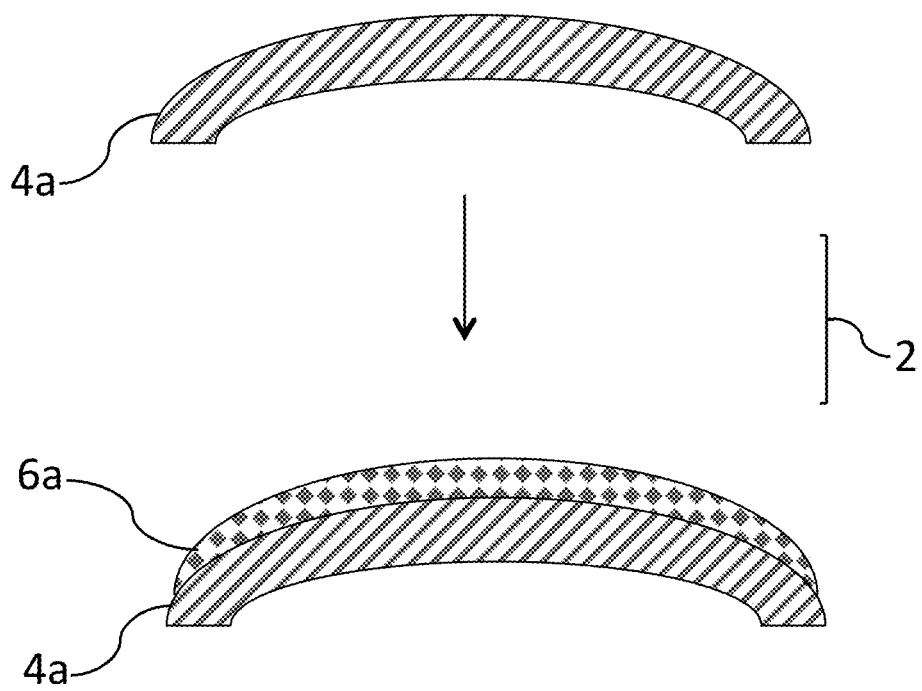
FIG. 3 is a cross-sectional drawing that shows the deposition of a molecular diamond mass on a non-planar, shaped substrate.

FIG. 3 shows the use of the combinatorial diamond unit cell synthesis reactions 2 with a shaped substrate. This reaction proceeds as has been disclosed hereinbefore and according to the disclosures of U.S. Pat. No. 8,778,295 and US 2014/0286851. Shaped substrate 4a is placed in a reaction chamber (not shown) such that, in the presence of either of the disclosed reactions 2 (i.e., reactions 2a or 2b), diamond unit cells deposit thereupon to form a shaped diamond mass 6a. The shaped diamond mass 6a conforms to the surface of the shaped substrate 4a and thus adopts a three dimensional shape defined by the structure of shaped substrate 4a. The shape shown in FIG. 3 is non-limiting in that it is only illustrative. A large variety of substrate shapes can be chosen for use with the combinatorial diamond unit cell synthesis reactions of the present invention. Shaped as shown in FIG. 3, the combination of substrate 4a and diamond mass 6a, for example, can function as a lens that is coated with diamond or a watch crystal. In the case of an optical device so structured, light can move first through either diamond mass 6a or substrate 4a, or light can pass simultaneously in both directions. Given the relatively low temperatures of the diamond unit cell combinatorial reaction, it can be used to deposit a diamond coating on vision correction glasses to render them "scratch proof." In this case, substrate 4a could be, for example, a polymeric (e.g., plastic) lens proof" diamond coating on a watch crystal. Another example of this general structure is a vehicle windshield that has been coated with diamond to strengthen it and render it less susceptible to scratches and other damage. Generally, the shaped substrate must be chosen such that it is composed of materials that are solid within the temperature ranges of the reaction, which depend upon the chosen reactants. These are just three examples of shaped substrates that can be coated with a diamond mass and are non-limiting.

EXAMPLE 1

In an experiment, a diamond mass was deposited on a platinum foil disk by reacting a carbon atom derived from the high energy discharge of cubane with what appeared to be tetrahedrane resulting from the catalysis of acetylene. The platinum disk was subsequently removed by dissolving it in aqua regia, which is non-reactive with diamond. This yielded a diamond mass in the form of a thin (1.74 mm) diamond disk reflecting the shape of the platinum disk substrate. Thus, the final product of this process was a transparent diamond disk, substantially free of bowing and cracks, that is a freestanding article of manufacture. That the diamond produced was an integral article free of cracks is an important advantage over the conventional art, which often employs a variety of complicating, extra method steps or modified substrates and/or apparatuses to avoid diamond cracking and breakage. In the present invention, the diamond disk is in the form of a wafer analogous to silicon wafers used in the current semiconducting manufacturing art.

Figure 4:
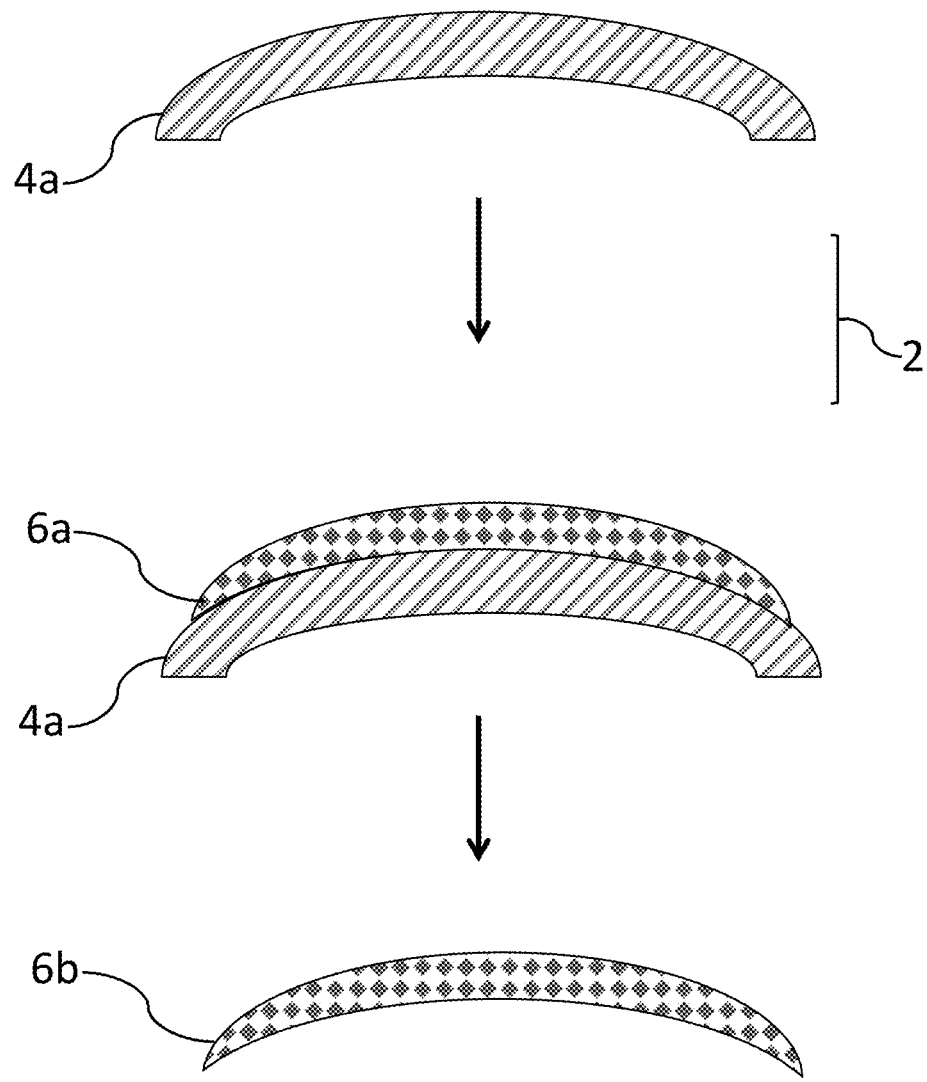
FIG. 4 is a cross-sectional drawing that shows the deposition of a molecular diamond mass on a non-planar, shaped substrate that is subsequently revoved from the molecular diamond mass.

Thus, FIG. 4 shows the process of FIG. 3 taken one step further. In the last step of the process shown in FIG. 4, convex circular substrate 4a (shown in cross section) is removed from diamond mass 6a to yield diamond mass 6b, which is a freestanding article of manufacture that also has a convex circular shape. Diamond mass 6b is a freestanding article that has been fabricated controllably in three dimensions and possesses a shape that is more complex than a simple planar structure. This is just one example of how a substrate upon which a diamond mass has been deposited can be removed from the diamond mass to yield a freestanding diamond article. If other metals are used as substrates, depending on the specific metal, it can be removed from the diamond mass by dissolving or etching it with an acid or base, removing it by plasma or laser ablation, or electrochemical means, mechanically removing it by machining or the use of abrasives, grinding, oxidizing, etc. If a wax or polymer is used as the substrate for diamond mass deposition, it can be removed from the diamond mass by dissolving it away from the diamond with an appropriate solvent. Other means of separating or removing a substrate material from a diamond mass are also possible.

The process of FIG. 4 can be used to fabricate a variety of freestanding articles of manufacture composed of diamond. For example, in FIG. 4, freestanding diamond mass 6b, can be a diamond lens, window, or other transparent product.

Figure 5:
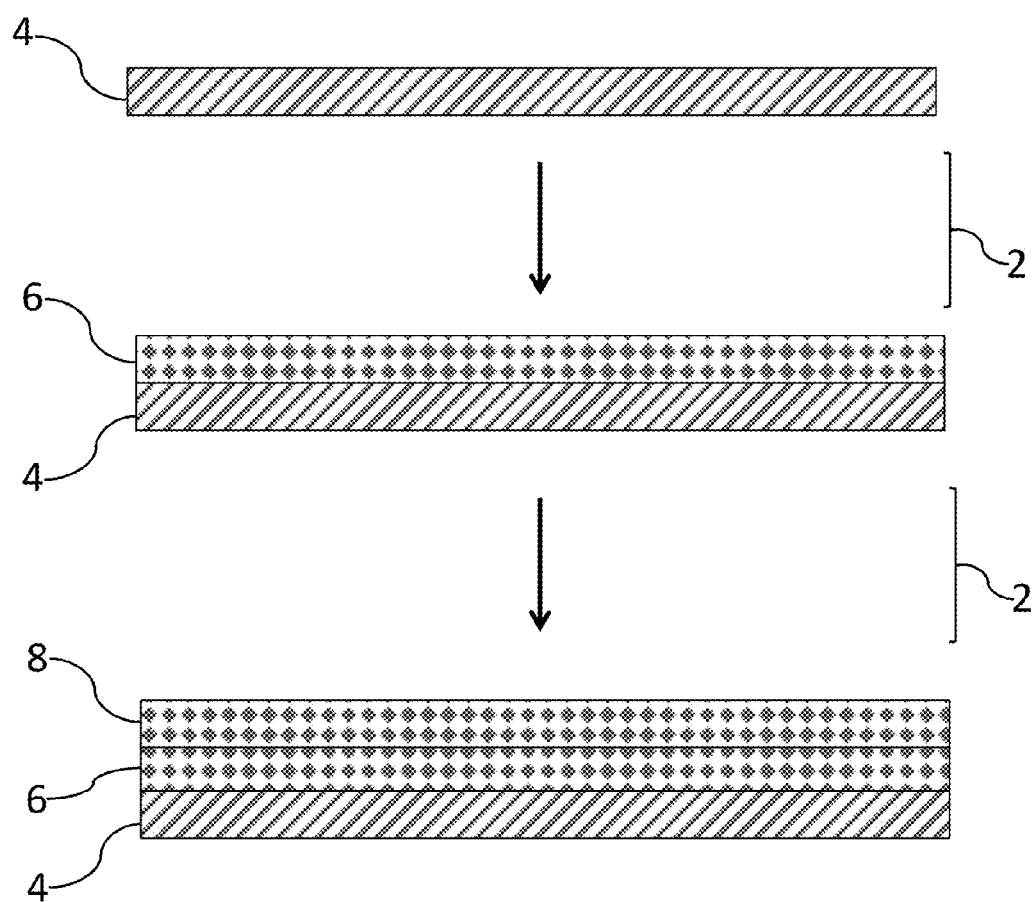
FIG. 5 is a cross-sectional drawing that shows the deposition of a two molecular diamond mass layers on a substrate.

The process of FIG. 5 is an extension of the process illustrated in FIG. 2 and discussed in relation thereto. This process consists of two repetitions of, generally, reaction 2 (i.e., reaction 2a or reaction 2b) and yields two layers of molecular diamond, items 6 and 8, respectively, deposited iteratively. Reaction 2 is one of the combinatorial unit cell diamond synthesis reactions disclosed in U.S. Pat. No. 8,778,295 (reaction 2a) and US 2014/0286851 (reaction 2b, which can be either in vapor phase or solid-state). First, substrate 4, shown as a cross section of a flat disk, is placed in a reaction chamber (not shown) such that, in the presence of the disclosed reactants, diamond unit cells deposit thereupon to form a diamond mass 6. Reaction 2 is then stopped. This is done, for example, by simultaneously diverting both reactant flows away from the deposition area followed by cessation of the reactant flows. A second diamond mass 8 can be deposited by repeating reaction 2 in the presence of the substrate 4 with diamond mass 6, now functioning as the substrate for diamond mass 8 in that diamond mass 8 is deposited upon diamond mass 6. Thus, two layers of diamond mass (6 and 8) are deposited on substrate 2. The term "layer" does not necessarily imply that there is a detectable delineation or demarcation between the diamond masses 6 and 8 so deposited.

Figure 6:
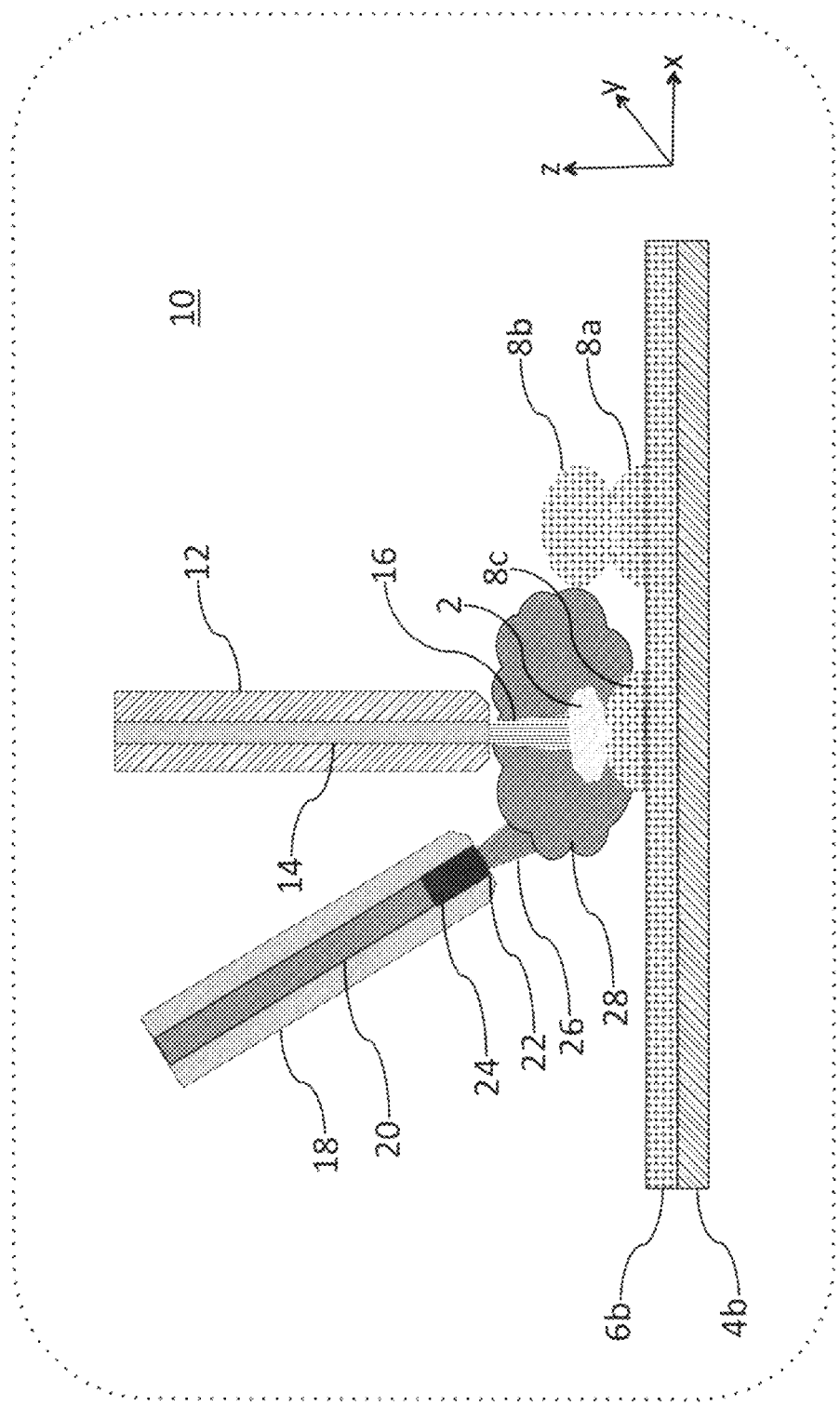
FIG. 6 is a schematic drawing that shows the controlled, three-dimensional shaping of a molecular diamond mass using a vapor phase reaction of the present invention.

FIG. 6 is a schematic cross section for purposes of illustration and is not drawn to scale. Shown within reaction chamber 10, is a controllable means for actively producing a three-dimensional shaped diamond mass upon a substrate. The substrate 4b can be diamond itself or some other material. However, as shown in FIG. 6, diamond mass 8a is being deposited as a localized, three-dimensional structure upon diamond mass layer 6b, which, itself, is deposited on substrate 4b. Alternatively, diamond mass 8a can just as effectively be deposited directly upon substrate 4b without diamond mass layer 6b. Reactant delivery apparatus 18 comprises conduit 20 and nozzle 22. The apparatus shown in FIG. 6 can use either of the reactions 2a or 2b generally designated as reaction 2. When using reaction 2a, the apparatus is provided with catalytic means to form what we believe to be tetrahedrane. Nozzle 22 includes a heated, porous catalytic frit 24 through which acetylene is passed (acetylene may be mixed with a carrier gas) to produce what we believe to be a flow of tetrahedrane 26 that spreads out as a localized cloud 28 including tetrahedrane of sufficient mass to react with all carbon atom reactant. Reactant delivery apparatus 12 comprises conduit 14 through which a flow of carrier gas and carbon atoms 16 produced by the high energy decomposition (e.g., due to a high energy discharge such as a switchable microwave, laser, RF, plasma, etc.) of a hydrocarbon source (e.g., cubane) is delivered and directed at a portion of substrate 6b. As shown, the region above diamond mass 8c is a localized cloud 28 including tetrahedrane into which carbon atoms 16, delivered through conduit 14, pass and mix to react with the tetrahedrane, shown as the reaction zone of reaction 2. Carbon atoms 16, delivered through conduit 14, can be provided as a constant stream, an interrupted flow, or an intermittent packet or "puff" of reactant (usually in a carrier gas). Thus, the carbon atoms can be provided as a modulated flow. Note that the tetrahedrane reactant flow can also be modulated. Reactant delivery apparatuses 12 and 18 may be ganged and controllably moved in concert three dimensionally to direct the diamond unit cell combinatorial reaction zone and diamond mass deposition at predetermined locations of the substrate. Furthermore, it is possible to also provide a work piece holder for holding the substrate that is capable of movement. This movement can be in three dimensions and/or it can be a modulated vibration to affect both the structure of the molecular diamond mass and/or its adherence to the substrate. Thus, there can be relative movement between the ganged delivery apparatuses 12 and 18 and the substrate by either moving the ganged delivery apparatuses 12 and 18, the substrate, or both. Additionally, it is also possible in some situations to provide no movement. Thus, for the purposes of this invention, the concept of relative motion also comprehends no movement or zero movement.

Reaction effluent is removed from the reaction chamber 10 through an effluent port that is not shown. Electronic and mechanical operations of the apparatus regarding parameters such as fluid flow, conduit/nozzle movement, pressures, temperature, and other reaction parameters can be automated by means of a microcontroller.

The apparatus of FIG. 6 can also be adapted for use with reaction 2b as implemented in the vapor phase embodiment. To do this, the reactant delivery apparatus 18 and nozzle 22 are provided without porous catalytic frit 24. Thus, a tetrahedranoidal reactant (e.g., in a carrier gas such as argon or helium) is delivered through conduit 20 of reactant delivery apparatus 18 and through nozzle 22 to form a tetrahedranoidal reactant cloud that mixes and reacts with carbon atoms as shown by reaction zone of reaction 2 to form a diamond mass resulting from the diamond unit cell combinatorial reaction disclosed in US 2014/0286851.

Diamond masses 8a, 8b, and 8c of FIG. 6 demonstrate a sequence of diamond mass depositions. Diamond mass 8a is deposited upon a portion of diamond mass layer 6b. Ganged reactant delivery apparatuses 12 and 18 are repositioned to a predetermined location in the Z-axis followed by deposition of diamond mass 8b upon diamond mass 8a. Ganged reactant delivery apparatuses 12 and 18 are repositioned in the X- and Z-axes to a predetermined location and diamond mass 8c is deposited upon a portion of diamond mass layer 6b. Generally, ganged reactant delivery apparatuses 12 and 18 can be positioned along the X-, Y-, and Z-axes, or any combination thereof, to deposit a diamond mass at any predetermined location of the diamond mass layer 6b or upon any other previously deposited diamond masses. There is no limitation on the size or shape of diamond masses 8a, 8b, and 8c of FIG. 6, other than what is inherent in the reaction. Thus, diamond masses 8a, 8b, and 8c can be structured with a variety of dimensions by moving the ganged reactant delivery apparatuses 12 and 18 in a predetermined way as the reactants are delivered.

The ganged delivery apparatus of FIG. 6 can alternatively be structured so that both reactants can be delivered simultaneously from a single delivery apparatus. Thus, for example that is not meant to be limiting, reactant delivery apparatus 18 and reactant delivery apparatus 12 could, in combination, comprise a coaxial structure with an inner conduit for delivering carbon atoms 16 and an outer conduit, coaxial with the inner conduit, for delivering either tetrahedrane or another tetrahedranoidal compound. Alternatively, a delivery apparatus can be comprised of a plurality of conduits and nozzles arranged in a predetermined configuration so as to produce a diamond mass of predetermined structure.

Thus, the apparatus of FIG. 6 includes a reaction chamber with at least one work piece holder for holding a deposition substrate, an effluent port remote from the substrate, a monitor for monitoring the effluent, a means for controlling the deposition substrate temperature, a means for controllably evaporating a tetrahedranoidal compound in a flow of inert carrier gas, a means for directing the flow of the tetrahedranoidal compound in the inert carrier gas to the vicinity of the deposition substrate, a means for controllably providing carbon atoms in an inert carrier gas, a conduit adapted to convey the carbon atoms into the flow of the tetrahedranoidal compound in the inert carrier gas in the vicinity of the deposition substrate, a means for diverting the inert carrier gases with the tetrahedranoidal compound and the carbon atoms, and a process controller. In addition, the reaction chamber may have a means for controlling the pressure within the reaction zone. The apparatus also includes a process controller or system controller for controlling pressure within the reactant chamber, the flow of the reactants in the inert carrier gases, the three dimensional, relative position of the conduit(s) with respect to the work piece(s), a means for controlling the diversion of flows of the reactants in the inert carrier gases, and timing of the process sequence. The process or system controller uses information from the effluent monitor to control the molecular diamond fabrication process.

A solid-state, combinatorial synthesis the of diamond unit cell reaction is disclosed in detail in US 2014/0286851. This is reaction 2b shown in FIG. 1. Generally, a solution of a tetrahedranoidal compound (e.g., benzvalene, tetrahedranone, etc.) and a solution of a carbon source, such as cubane, are prepared in a stoichiometric (molar) ratio of 8 to 1, respectively, in a solvent such as dry dichloromethane. These solutions are mixed, yielding a homogeneous, uniform solution of the two reactant compounds. Solvent is evaporated yielding a homogeneous, uniform, solid mixture of the tetrahedranoidal compound and the carbon source (e.g., cubane). The mixture is energized by exposure to a microwave or other appropriate high energy discharge known in the bond cleavage art, which causes the diamond forming reaction.

The diamond unit cell forming reaction can be conducted in the solid state using a homogeneous mixture of cubane and any of the above-cited tetrahedranoidal compounds. This homogeneous blend is a molar ratio of 8:1, tetrahedranoid-to-cubane.

A cubane molecule decomposes to provide eight carbon atoms and eight hydrogen atoms. The skilled practitioner will recognize that a high degree of stoichiometric precision is required when preparing the homogeneous blend of cubane and tetrahedranoid if a diamond product of high purity is to be obtained by the diamond unit cell forming reaction. An excess of cubane (the carbon atom source) introduces graphitic and amorphous carbon impurities into the diamond product. Excess tetrahedranoid can introduce graphitic, carbenoid, and even heteroatom impurities into the diamond product. Gravimetric methods are unlikely to achieve this level of precision and are difficult to perform with contact-sensitive materials such as benzvalene and 2,3,4-methynylcyclobutanone; 3,4-diazabenzvalene is unstable above −60° C.

Forming stock solutions of the individual reactants (cubane and tetarhedranoid) can achieve this precision with the use of liquid chromatographic equipment in tandem with mass spectrometric instrumentation (hplc-ms). Such equipment is commercially available and can attain five decimal place precision (and even higher for some research specification models). This equipment can readily identify and separate impurities common to tetrahedranoidal molecules. For benzvalene, the impurity that is observed is benzene. For 3,4-diazabenzvalene and 2,3,4-methynlcyclobutanone ("tetrahedranone"), the impurity is dicyclobutadiene, which arises from the ejection of dinitrogen or carbon monoxide, respectively, from these tetrahedranoidal compounds. These are four-carbon units that probably form butadiene, which dimerizes to the final impurity, dicyclobutadiene. Thus, it is advantageous to use benzvalene as the tetrahedranoidal reactant for the solid-state diamond unit cell forming reaction. It is the most stable of the three tetrahedranoidal compounds, and it is fairly economical to use being readily prepared by standard organic synthesis methods from inexpensive reagents.

The use of precisely calibrated stock solutions of the individual reactants using hplc-ms instrumentation also provides a means for maintaining the stoichiometric precision necessary for producing diamond by the solid state diamond unit cell forming reaction. The two solutions are combined and freed of solvent carefully at reduced pressure and at reduced temperature in the reaction vessel in which the diamond unit cell reaction occurs. The solid blend is held at low temperature in an inert atmosphere because the vapor pressures of the individual reactants are sufficient at ambient temperature (benzvalene: 106.12 mm Hg; cubane: 1.1 mm Hg) to alter the stoichiometric precision of the homogeneous blend by evaporative loss. The combination of double manifold line manipulations and hplc-ms instrumentation simplifies the task of preparing a stoichiometrically precise blend of purified reactants as well as maintaining their purity and stoichiometry.

Figure 7:
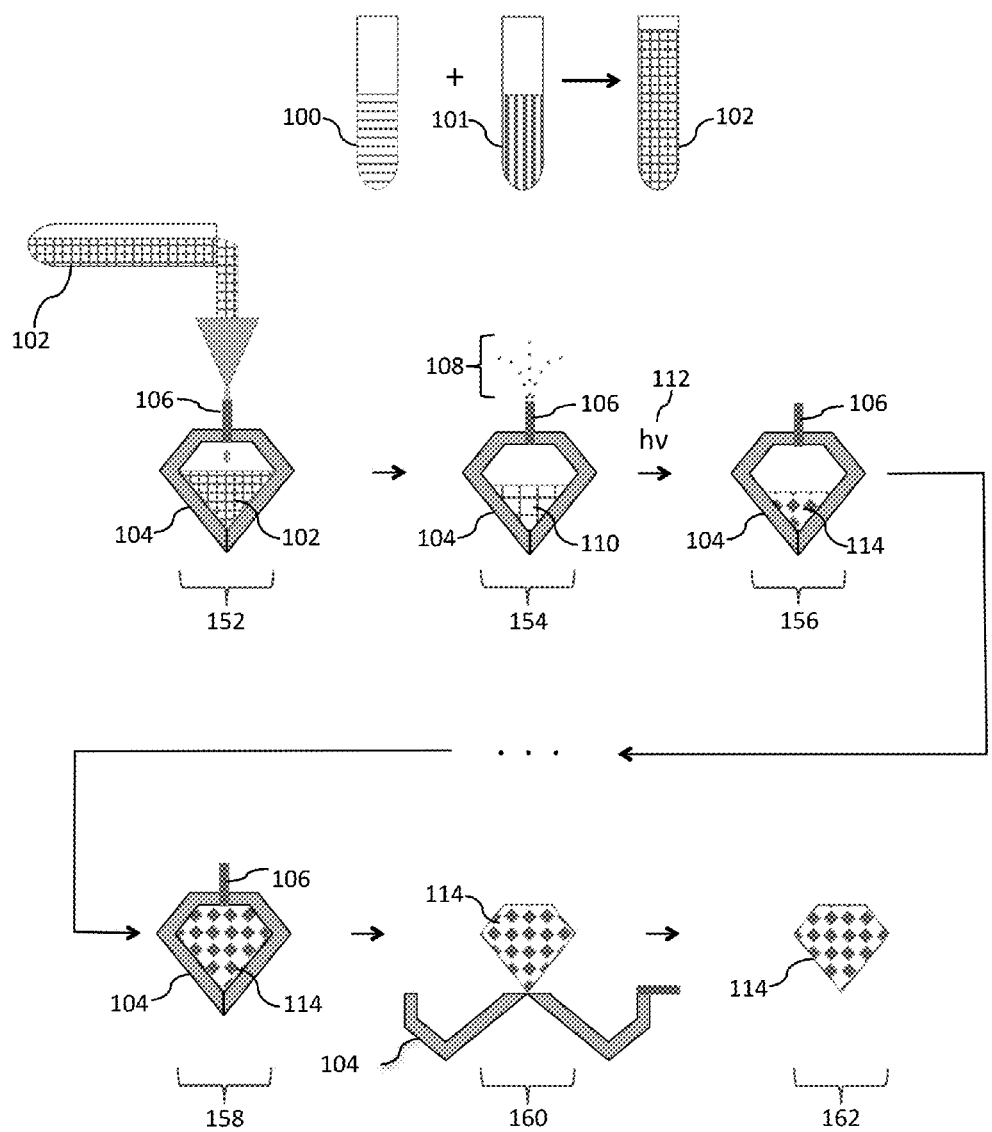
FIG. 7 is a schematic drawing that shows the controlled, three-dimensional shaping of a molecular diamond mass of predetermined morphology with a mold.

FIG. 7 is a schematic, cross-sectional illustration of the use of this reaction 2b in the solid-state embodiment to produce a diamond mass as a freestanding article or product of a predetermined, three-dimensional shape. A tetrahedranoidal compound solution 100 is prepared, for example, from benzvalene and dry dichloromethane, and a carbon source solution 101 is prepared, for example, from cubane and dry dichloromethane. These are mixed in a stoichiometric molar ratio of 8:1, respectively, to form homogeneous reactant solution 102 with dicholoromethane as the solvent. At 152, a homogeneous reactant solution 102 is injected into mold 104 through port 106. As shown, mold 104 is a closed mold but the disclosed process will also work with open molds, segmented molds, and other molds. The use of molds can be done within a reaction chamber or in an otherwise controlled environment. For the present invention, a mold is essentially a shaped substrate wherein the molecular diamond mass takes on the three-dimensional structure defined by the mold. As shown at 154, solvent molecules 108 are evaporated under vacuum from mold 104 through mold port 106 to leave homogeneous solid mixture 110 of benzvalene and cubane. Effluent gas is monitored using, for example (but not limited to), GC-MS to confirm the complete removal of the dichloromethane solvent. The volume of homogeneous solid mixture 110 is less than homogeneous reactant solution 102 due to the loss of solvent volume through evaporation. Homogeneous solid mixture 110 is exposed to a high-energy discharge 112 (e.g., microwave, laser, RF, plasma, etc.), that can be controllably switched on and off, and which causes the reaction to yield diamond mass 114. The high-energy discharge is stopped when effluent monitoring indicates that the effluent is free of hydrogen or acetylene. Note, at 156, that diamond mass 114 has a volume that is smaller than homogeneous solid mixture 110. The three dimensional shape of diamond mass 114 takes on the predetermined shape of the part of the mold volume it occupies. On a second cycle, steps 152, 154, and 156, are repeated and additional homogeneous reactant solution 102 is injected into mold 104 through port 106, but, this time, the reactant solution 102 not only contacts the inner walls of mold 104, but also the surface of previously formed diamond mass 114. When solvent is evaporated from this homogeneous reactant solution 102, the remaining homogeneous solid mixture 110 is in contact with earlier formed diamond mass 114. When exposed to a high-energy discharge 112 from a switchable device (e.g., microwave, laser, RF, plasma, etc.), an additional layer or level of diamond mass is formed but not necessarily with a distinguishable delineation or demarcation between it and the previously formed diamond mass. The process just described is repeated for as many cycles as necessary for the diamond mass to occupy fully the complete mold volume. Thus, at 158, the mold 104 is shown fully occupied by the diamond mass. At 160, diamond mass 114 is released from mold 104 as a freestanding article of manufacture at 162 that reflects the three-dimensional shape predetermined by mold 104. It is necessary during this process to follow carefully the details of the reaction (e.g., temperature, pressure, purification of reactants, etc.) disclosed in US 2014/0286851 (incorporated herein by reference).

Although the process of FIG. 7 can be performed manually in the laboratory, it is best implemented automatically under the control of a programmable process or system controller that controls and senses environmental conditions (e.g., temperature, pressure, effluent, etc.) within the reaction chamber, controls flow and dispensing of the homogeneous reactant solution 102 that is injected into mold 104 through port 106, activates the switchable high energy discharge means, and controls timing of the process sequence. The effluent monitor provides information for governing the timing of the reaction process and sequences thereof.

The diamond molding process of the present invention can be adapted to form three-dimensional, shapeable diamond masses whose shapes are controlled by the morphology of the mold, which, for the purposes of the present invention, is considered a type of substrate. For example, a cylindrical mold can be used to fabricate large cylinders of diamond. Flat, open, circular molds can be used to fabricate diamond wafers using the vapor phase or solid-state reactions of the chemistry shown in FIG. 1. Additionally, molds can rest upon a planar or otherwise shaped substrate so that they are open adjacent to the surface of the substrate. Thus, molded molecular diamond masses can be actively fabricated controllably and of three-dimensional predetermined shapes that adhere to the surface of a substrate.

FIGS. 8a through 8f show, in cross section, the active, controlled, three dimensional shaping of a molecular diamond mass using the unit cell diamond synthesis reaction of the present invention in what is an additive fabrication, additive manufacturing, or three-dimensional printing process. This process uses reaction 2b of FIG. 1 as it is implemented in the solid-state embodiment for the combinatorial production of the diamond unit cell and it provides for the active shaping of a molecular diamond mass or masses of predetermined structure or morphology. Thus, a molecular diamond mass is shapeable using this process. This reaction is disclosed in detail in US 2014/0286851. It is best performed within a reaction chamber or other controlled environment. Generally, this process involves delivering or dispensing a homogeneous solution of a tetrahedranoidal compound such as, for example, benzvalene, and a carbon source such as cubane. Other examples of tetrahedranodal compounds that can be used in embodiment of the present invention include 2,3,4-methynylcyclobutanone ("tetrahedranone") and 3,4-diazabenzvalene. The homogeneous solution is then evaporated to yield a homogeneous, uniform solid mixture of the tetrahedranoidal compound and the carbon source, which, when exposed to a high-energy discharge, forms a molecular diamond mass. In FIGS. 8a through 8f, dispensing device 230 can be a pipette or other liquid delivery device known in the dispensing art that is controllable in terms of its position in three axes and dispensed volume. The dispensing device 230 as shown is a liquid pipette with a gas "piston" that pushes out a predetermined volume of fluid. Because other specific delivery devices can also be used, the particular example of dispensing device 230 is illustrative and non-limiting. Other dispensing means can be used such as a pipette with a solid piston, an ink jet, etc. The predetermined volume of fluid dispensed by dispensing device 230 can be as small as aerosol droplets (e.g., diameters up to ~1 µm) or larger. Choice of dispensed volume is determined by such factors as the size and morphology of the final diamond mass product, the speed at which the article is fabricated, etc.

Figure 8A:
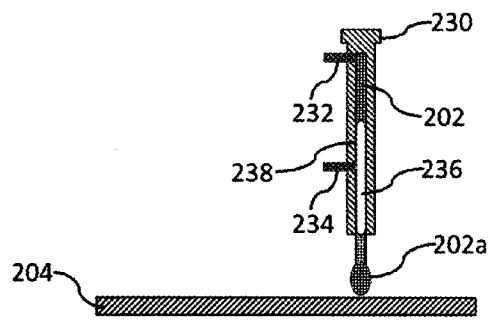
FIG. 8a-f are cross-sectional drawings showing the controlled, active, three-dimensional shaping of a molecular diamond mass of predetermined morphology using additive fabrication in combination with the solid state reaction of the present invention.
Figure 8B:
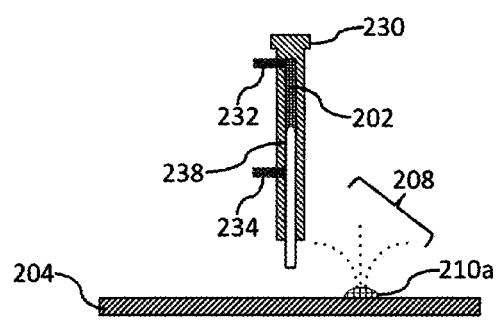
Figure 8C:
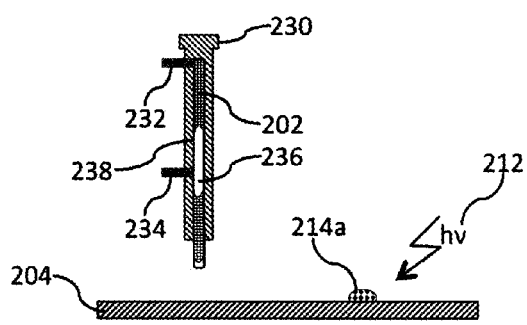
Figure 8D:
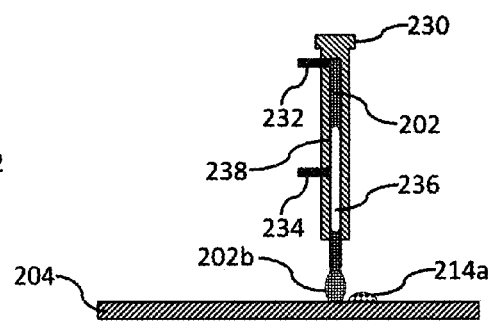
Figure 8E:
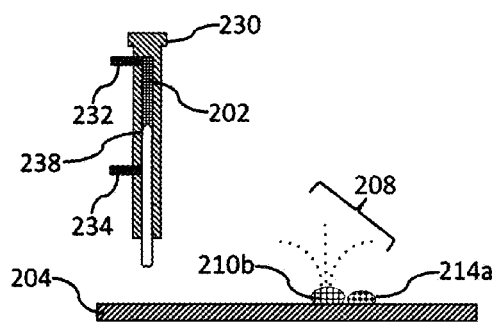
Figure 8F:
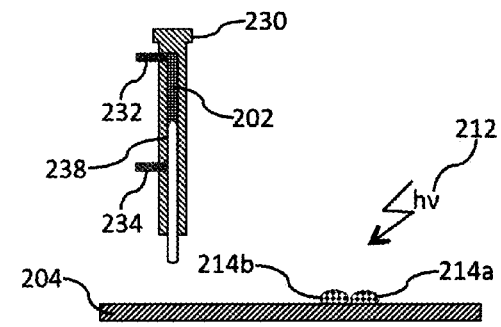

In FIG. 8a, homogeneous solution 202 of, for example, benzvalene and cubane in a stoichiometric ratio of 8 to 1, respectively, is provided to dispensing device 230 through liquid inlet port 232, into the interior chamber 238 of dispensing device 230. A gas, such as argon, is introduced into interior chamber 238 of dispensing device 230 through gas inlet port 234 such that it forces out a predetermined volume of homogeneous solution 202 to form homogeneous solution drop 202a positioned at a controlled, predetermined location on substrate 204. Thus, FIG. 8a shows homogeneous solution drop 202a being dispensed onto substrate 204. FIG. 8b shows homogeneous solid mixture 210a that results from the evaporation 208 of solvent from the homogeneous solution drop 202a. Homogeneous solid mixture 210a has a smaller volume than the homogeneous solution drop 202a yet it remains in the same predetermined location where homogeneous solution drop 202a was dispensed upon substrate 204. In FIG. 8c, homogeneous solid mixture 210a has been exposed to a high-energy discharge such as microwave energy, laser radiation, or some other high-energy discharge known in the bond cleavage art and can be controllably switched on and off. This results in the formation of diamond mass 214a according to the solid-state combinatorial synthesis of the diamond unit cell disclosed in detail in US 2014/0286851. Dispensing device 230 is controllably moved to a new predetermined location in the plane defined by the X-axis and Y-axis. As shown, in FIG. 8d, dispensing device 230 is controllably moved to a new predetermined location adjacent diamond mass 214a. Dispensing device 230 can be actively and controllably moved to any predetermined location on substrate 204. Further, dispensing device 230 can be controllably moved vertically, i.e., in the Z-axis, so as to enable deposition of an additional diamond mass upon previously deposited diamond masses such as, for example, upon diamond mass 214a. It is also possible to provide a work piece holder (for holding the substrate) that is capable of movement. This movement can be in three dimensions and/or it can be a modulated vibration to affect both the structure of the molecular diamond mass and/or its adherence to the substrate. Thus there can be relative movement between the dispensing device 230 and substrate 204. For the purposes of this invention, the concept of relative movement can also mean no movement or zero movement. Thus, the additive manufacturing, additive fabrication process, or three-dimensional printing process of FIGS. 8a through 8d illustrate the active, controllable fabrication of a three dimensional diamond mass of complex, predetermined structure that is formed by repeating the cycle of reactant dispensing and reaction discussed with respect to FIGS. 8a through 8c. In FIG. 8d, additional homogeneous solution 202 is provided to dispensing device 230 through liquid inlet port 232, into the interior chamber 238 of dispensing device 230. A gas, such as argon, is introduced into interior chamber 238 of dispensing device 230 through gas inlet port 234 such that it forces out a predetermined volume of homogeneous solution 202 to form homogeneous solution drop 202b positioned adjacent diamond mass 214a. Thus, FIG. 8d shows homogeneous solution drop 202b being dispensed onto substrate 204. FIG. 8e, shows homogeneous solid mixture 210b that results from the evaporation 208 of solvent from the homogeneous solution drop 202b. Homogeneous solid mixture 210b has a smaller volume than the homogeneous solution drop 202b yet it remains in the same predetermined location where homogeneous solution drop 202b was dispensed upon substrate 204. In FIG. 8f, homogeneous solid mixture 210b has been exposed to a high-energy discharge such as microwave energy, laser radiation, or some other high-energy discharge known in the bond cleavage art. This results in the formation of diamond mass 214b according to the solid-state combinatorial synthesis of the diamond unit cell as disclosed in detail in US 2014/0286851.

The system disclosed provides for relative, three-dimensional movement between dispensing device 230 and substrate 204, which is held in a work piece holder (not shown). Thus, the dispensing device 230 and/or the substrate 204 (held in a work piece holder) can be moved with respect to each other. Furthermore, even though only one substrate 204 and dispensing device 230 are shown in FIGS. 8a through 8f, a plurality of substrates (held in one or more work piece holders) and a plurality of dispensing devices are comprehended by the present invention.

There is no limitation on the size and shape of diamond masses 214a and 214b. For example, by moving dispensing device 230 as homogeneous solution 202 is dispensed, a straight or curved line of homogeneous solid mixture 210a or 210b can be put onto substrate 204, which, after exposure to a high-energy discharge can yield a diamond mass 214a or 214b whose size and shape reflects the predetermined volume and pattern of the originally dispensed homogeneous solution 202. Furthermore, dispensing device 230 can be designed so as to comprise multiple pipettes or other fluid delivery devices either connected physically or controlled in such a way that they act in concert to dispense homogeneous solution 202 in a predetermined volume, shape, or pattern.

There is no requirement that volume, shape, or pattern of each fluid delivery step be the same.

Homogeneous solution 202 can be prepared using a number of solvents. For the purposes of the present invention, the solvent should be chosen so that it is liquid at the reaction temperatures, solutes are fully and strongly miscible therein, and has a relatively high vapor pressure (i.e., is highly volatile) to facilitate rapid evaporation and thus quickly form a homogeneous solid mixture as exemplified, for example by homogeneous solid mixtures 210a, and 210b. While US 2014/0286851 details the use of dichloromethane as a solvent for the solid-state reaction of a tetrahedranoidal compound with a carbon atom to form the diamond unit cell, other solvents can also be used. As disclosed in US 2014/0286851, solvent was freed by evaporation from the reactant solution at a temperature of between −20° C. and −45° C. The boiling point (bp) of dichloromethane is 39.6° C. Other suitable solvents might include butane (bp=−1° C.), pentane (bp=35.9° C.), and various other refrigerant gases such as hydrofluorocarbons (HFCs).

In an alternative embodiment of FIGS. 8a through 8f, instead of dispensing a homogeneous solution of the reactants in a solvent, the dispenser delivers a homogeneous solid mixture directly to the substrate. In this case, it is important to keep the homogeneous solid mixture from contacting sharp edges to avoid a potential, violent decomposition of the tetrahedranoidal compounds. In this embodiment, the homogeneous solid mixture is formed from the homogeneous solution either before the solid is provided to the dispenser or once it is actually in the dispenser.

Thus, as contemplated by the present invention, the apparatus of FIGS. 8a through 8f includes a reaction chamber or other controlled environment such as clean rooms used in the semiconductor and optics industries. It also includes a means for introducing an inert gas into the reaction chamber or controlled environment, at least one work piece holder for holding a substrate or substrates in the reaction chamber or controlled environment, a reservoir or container for holding the homogeneous reactant solution of a tretrahedranoidal compound and a carbon source compound, at least one reactant dispenser within the reaction chamber that is capable of relative, three-dimensional movement with respect to a substrate that dispenses homogeneous reactant solution at a predetermined location, a conduit for conveying the homogeneous reactant solution from the reservoir or container to the dispenser, an effluent port in the reaction chamber or controlled environment that is remote from the work piece holder or holders, an effluent monitor, and a switchable high energy discharge means for cleaving covalent bonds of the carbon source compound for releasing carbon atoms. The apparatus also includes a process or system controller that can be implemented as a computer, microcontroller, or customized/dedicated control system. The process controller controls pressure, temperature and other parameters within the reaction chamber or controlled environment, flow of the reactant to the dispenser(s), the relative position(s) of the dispenser(s) with respect to the deposition substrate or substrates held by the work piece or work pieces, dispensing of the homogeneous reactant solution, activation of the switchable high energy discharge means, timing of process sequence, etc. The effluent monitor provides information to the controller that is used for governing the timing of the reaction process and sequences thereof.

Figure 9:
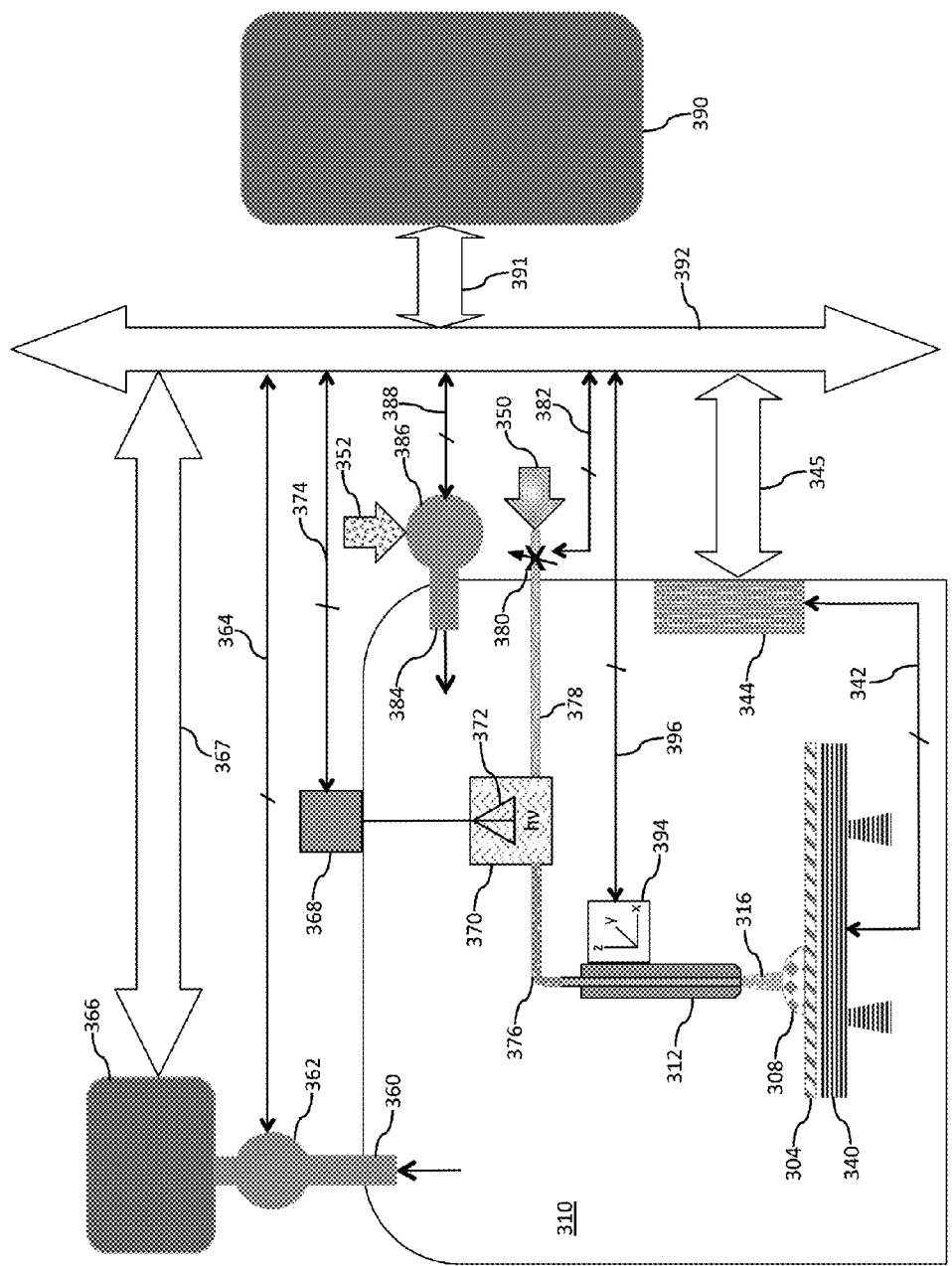
FIG. 9 illustrates in schematic form one embodiment of an apparatus and control system for implementing vapor phase reactions of the present invention.

FIG. 9 illustrates, in schematic form, the apparatus and control system for implementing the vapor phase reactions of the present invention. Either of the reactions of FIG. 1 can be performed but, as shown, the configuration of FIG. 9 implements reaction 2b of FIG. 1 in the vapor phase. However, when reaction 2a of FIG. 1 is used, modifications, discussed below, are made to the apparatus.

Reaction chamber 310 provides a controlled environment specifically intended to maintain the physical and chemical conditions conducive to the production of molecular diamond (i.e., the diamond unit cell) to yield useful, shapeable diamond masses that can be components of products or products themselves. As shown, work piece holder 340 supports deposition substrate 304. Although only one work piece holder 340, is shown, a plurality of work piece holders with associated deposition substrates in a single reaction chamber 310 can be accommodated by the present invention. Work piece holder 340 includes a means for locally controlling the temperature of the deposition substrate 304, the details for which are not shown. Temperature control lines 342 communicate data to and from the system controller 390 through sensor suite and interface 344, through sensor bus 345, main system bus 392, and controller bus 391. Sensor suite and interface 344, contains one or more temperature sensors and one or more pressure sensors. It can accommodate additional sensors. Although sensor suite and interface 344 is shown as a single, integrated module at one location in reaction chamber 310, alternatively, the sensors can be placed at disparate locations within the reaction chamber 310. Sensor suite and interface 344 communicates data to and from the system controller 390 through sensor bus 345, main system bus 392, and controller bus 391. Inlet port 384, provides for an inflow of inert gas 352 that is mixed with a vaporized form of a tetrahedranoidal molecule such as benzvalene, tetrahedranone, etc., obtained by controlled heating of the tetrahedranoidal molecule used (details not shown). Inert FIG. 9 illustrates, in schematic form, the apparatus and control system for implementing the vapor phase reactions of the present invention. Either of the reactions of FIG. 1 can be performed but, as shown, the configuration of FIG. 9 implements reaction 2b of FIG. 1 in the vapor phase. However, when reaction 2a of FIG. 1 is used, modifications, discussed below, are made to the apparatus.

Reaction chamber 310 provides a controlled environment specifically intended to maintain the physical and chemical conditions conducive to the production of molecular diamond (i.e., the diamond unit cell) to yield useful, shapeable diamond masses that can be components of products or products themselves. As shown, work piece holder 340 supports deposition substrate 304. Although only one work piece holder 340, is shown, a plurality of work piece holders with associated deposition substrates in a single reaction chamber 310 can be accommodated by the present invention. Work piece holder 340 includes a means for locally controlling the temperature of the deposition substrate 304, the details for which are not shown. Temperature control lines 342 communicate data to and from the system controller 390 through sensor suite and interface 344, through sensor bus 345, main system bus 392, and controller bus 391. Sensor suite and interface 344, contains one or more temperature sensors and one or more pressure sensors. It can accommodate additional sensors. Although sensor suite and interface 344 is shown as a single, integrated module at one location in reaction chamber 310, alternatively, the sensors can be placed at disparate locations within the reaction chamber 310. Sensor suite and interface 344 communicates data to and from the system controller 390 through sensor bus 345, main system bus 392, and controller bus 391. Inlet port 384, provides for an inflow of inert gas 352 that is mixed with a vaporized form of a tetrahedranoidal molecule such as benzvalene, tetrahedranone, etc., obtained by controlled heating of the tetrahedranoidal molecule used (details not shown). Inert gas 352 flows into reaction chamber 310 transporting tetrahedranoidal molecule reactant vapor, and, as shown, may be pressurized by inlet pump 386 under the control of inlet pump control lines 388. Inlet pump 386 may be provided with dedicated flow sensor or sensors (preferably non-contact sensors) and/or pressure sensors that are not shown. Inlet pump control lines 388 communicate with system controller 390 through main system bus 392 and controller bus 391. It is also possible to maintain desired flow and pressure in reaction chamber 310 using the pressure of the gas storage tank and its regulator alone, making the inlet pump 386 unnecessary. Effluent leaves reaction chamber 310 through effluent port 360. As shown, effluent pump 362 controls flow of effluent from reaction chamber 310. There may be circumstances when effluent pump 362 is not used, and, thus, effluent exits reaction chamber 310 through effluent port 360 passively (e.g., due to the pressure 360) but through a controllable valve (not shown). Effluent pump 362 connects through to GC-MS 366 (gas chromatograph in tandem with a mass spectrometer), for effluent analysis. Effluent pump 362 may be separate from or integrally a part of GC-MS 366. When separate from mass GC-MS 366, effluent pump 362 is controlled by the system controller 390 through effluent pump control lines 364. When integrally a part of GC-MS 366, effluent pump 362 may be directly or indirectly controlled through GC-MS bus 367, which connects communicatively through to system controller through main system bus 392 and controller bus 391. High-energy discharge module 368 can be a microwave or other appropriate high energy discharge device (e.g., RF radiation, laser radiation, electrostatic discharge, plasma, etc.) known in the bond cleavage art, which effects the decomposition of cubane to carbon atoms and free hydrogen atoms. It is switchable and under the control of system controller 390 through high energy discharge module control lines 374, which communicate with system controller 390 through main system bus 392 and controller bus 391. Discharge chamber 370 includes discharge antenna 372, which, as shown, can be a microwave or other wavelength RF antenna. In the case of a microwave high-energy discharge, discharge chamber 370 can be, effectively, provided with energy through a waveguide. As shown, a carbon source such as cubane vapor obtained by controlled heating in argon carrier gas 350 is transported through high-energy discharge module 368 via conduit 378. Carbon source flow control is a result of both carbon source vaporization control (details not shown) and argon carrier gas 350 flow, which is controlled by valve 380. Valve 380 is under the control of the systems controller 390 through valve control lines 382. Valve control lines 382 communicate with systems controller 390 through main system bus 392 and controller bus 391. Vaporization of the carbon source is mediated by the system controller. Within high-energy discharge module 368, the carbon source, such as cubane, is dissociated, under the influence of the high-energy discharge, into carbon atoms in the inert carrier gas. This exits high-energy discharge module 368, through carbon conduit 376 and enters reactant delivery apparatus 312 through which it passes and is controllably directed at a predetermined location on deposition substrate 304. The relative position of delivery apparatus 312 is controlled by three dimensional position controller 394 (details not shown). Three dimensional position controller 394 is, in turn, controlled through position control lines 396, which communicate through to the systems controller 390 through main system bus 392 and controller bus 391. A single reaction chamber 310 can also accommodate multiple reactant delivery apparatuses.

If it is desired to use the apparatus of FIG. 9 with reaction 2a of FIG. 1, that is, the reaction that includes what we believe to be tetrahedrane, some modifications to the apparatus are necessary. In particular, reactant delivery apparatus 312 must be modified to include a heated catalytic frit so that acetylene can be converted to what we believe to be tetrahedrane. This is provided within a carrier gas to deposition substrate 304 and, preferably, the distance between the reactant delivery apparatus 312 and the deposition substrate 304 is 5 mm or less. The ganged reactant delivery apparatus shown in FIG. 6 meets the requirements of reaction 2a of FIG. 1. As already discussed, alternative reactant delivery structures can also be used, for example, a compound coaxial conduit design, where an outer conduit delivers acetylene to a heated, catalytic frit, and surrounds an inner conduit that delivers carbon atoms. Lines are connected through the reaction chamber 310 walls for conducting the reactants and carrier gases to the reactant delivery apparatus. Upon shut down of the combinatorial process of the present invention, system controller 390 diverts gas streams, switches off high energy discharge, and stops both vaporization processes (tetrahedranoidal molecule vaporization and carbon source vaporization). Details of the shut down procedure are not shown.

Figure 10:
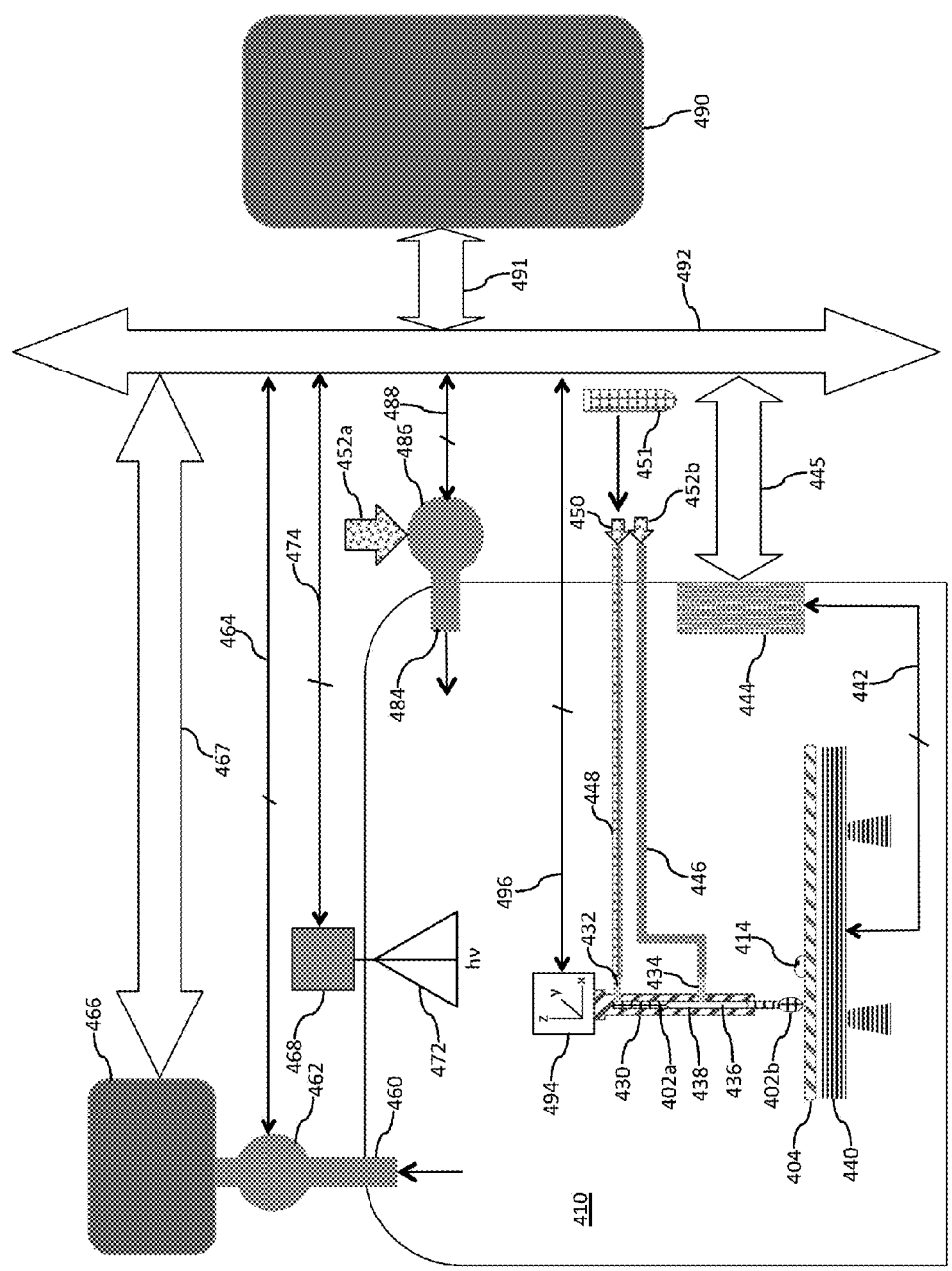
FIG. 10 illustrates in schematic form one embodiment of an apparatus and control system for implementing solid state reactions of the present invention.

FIG. 10 illustrates, in schematic form, the apparatus and control system for implementing the solid state reaction of the present invention in an additive manufacturing environment. Reaction chamber 410 provides a controlled environment specifically intended to maintain the physical and chemical conditions conducive to the production of molecular diamond (i.e., the diamond unit cell) to yield useful, shapeable diamond masses that can be components of products or products themselves. As shown, work piece holder 440 supports deposition substrate 404. Although only one work piece holder 440, is shown, a plurality of work piece holders with associated deposition substrates in a single reaction chamber 410 can be accommodated by the present invention. Work piece holder 440 includes a means for locally controlling the temperature of the deposition substrate 404, the details for which are not shown. Temperature control lines 442 communicate data to and from the system controller 490 through sensor suite and interface 444, through sensor bus 445, main system bus 492, and controller bus 491. Sensor suite and interface 444, contains one or more temperature sensors, and one or more pressure sensors. Although sensor suite and interface 444, is shown as a single, integrated module at one location in reaction chamber 410, alternatively, the sensors can be placed at disparate locations within the reaction chamber 410. Sensor suite and interface 444 communicates data to and from the system controller 490 through sensor bus 445, main system bus 492, and controller bus 491. Inlet port 484, provides for an inflow of inert gas 452a into reaction chamber 410 and, as shown, is pressurized by inlet pump 486 under the control of inlet pump control lines 488. Inlet pump 486 may be provided with dedicated flow sensor or sensors (preferably non-contact sensors) and/or pressure sensors that are not shown. Inlet pump control lines 488 communicate with system controller 490 through main system bus 492, and controller bus 491. It is also possible to maintain desired flow and pressure in reaction chamber 410 through the pressure of the gas storage tank and its regulator alone, making the inlet pump 486 unnecessary. Effluent exits reaction chamber 410 through effluent port 460 either passively (e.g., through a controllable valve) or under control of effluent pump 462. Effluent pump 462 connects through to GC-MS 466, for effluent analysis. Effluent pump 462 may be a separate from, or integrally a part of, GC-MS 466. When separate from GC-MS 466, effluent pump 462 is controlled by the system controller 490 through effluent pump control lines 464. When integrally a part of GC-MS 466, effluent pump 462 may be directly or indirectly controlled through mass spectrometer bus 467, which connects communicatively through to system controller through main system bus 492, and controller bus 491. High-energy discharge module 468 can be a microwave or other appropriate high energy discharge device (e.g., RF radiation, laser radiation, electrostatic discharge, plasma, etc.) known in the bond cleavage art, which effects the decomposition of cubane to carbon atoms and free hydrogen atoms. It is switchable and under the control of system controller 490 through high energy discharge module control lines 474, which communicate with system controller 490 through main system bus 492 and controller bus 491. As shown in FIG. 10, discharge antenna 472 is disposed within reaction chamber 410. In the case of a microwave high-energy discharge, reactant chamber 410 can be, effectively, provided with energy through a waveguide. Similarly to what was discussed in relation to FIGS. 7 and 8, homogeneous reactant solution 450 is provided by solution conduit 448 through liquid inlet port 432 to dispensing device 430. Homogeneous reactant solution 450 contained in reservoir 451 can be, for example, benzvalene and cubane in a stoichiometric ratio of 8 to 1, respectively. Once the homogeneous reactant solution 450 (provided to dispensing device 430 through solution conduit 448) is in the interior chamber 438 of dispensing device 430, it is designated 402a. Inert gas 452b (e.g., argon) is provided to interior chamber 438 of dispensing device 430 by gas conduit 446 through gas inlet port 434 and acts as a gaseous piston to dispense homogeneous reactant solution drop 402b onto deposition substrate 404. Details of the control of inert gas 452b flow and homogeneous reactant solution 450 dispensing are not shown. However, control of dispensing volume, frequency, timing, sequence, and other dispensing parameters is through the system controller 490. Reactant solution drop 402b solvent is evaporated, thus forming a solid homogeneous reactant mixture. System controller 490 monitors solvent evaporation with GC-MS data. Once evaporation is complete as determined from GC-MS data, a high energy discharge is switched on to complete the formation of the molecular diamond mass. Upon the completion of the diamond unit cell reaction as determined by GC-MS data, the high energy discharge is switched off. This process is repeated until the predetermined diamond mass shape is produced. Diamond mass 414 is shown as a previously formed diamond mass on deposition substrate 404. The relative position of dispensing device 430 is controlled by three dimensional position controller 494 (details not shown). Three dimensional position controller 494 is, in turn, controlled through position control lines 496, which communicate through to the systems controller 490 through main system bus 492 and controller bus 491. A single reaction chamber 410 can also accommodate multiple reactant delivery apparatuses.

The Control System

The control system of the apparatus comprises a computer system in combination with hardware interfaces for sensor input data and output control signals for actuators. Control system software for the computer is designed with a modular structure, although other schemes are also possible. Process control can employ previously determined, preferred parameters that are stored in memory "maps" for use with process control strategies such as closed-loop, fuzzy logic, etc., which are commercially available. The general structure applies to both vapor phase and solid state embodiments of the present invention. Generally, data are received from sensors in the apparatus and processed by the control system. When data indicate that a specific parameter's value has diverged from the desired set point, control signals are generated by the computer and routed through the control system interface to actuators in the apparatus. These signals correct for the difference between the actual measured parameter value and the target or desired value for that parameter.

Thus, for example, the internal temperature and pressure of the reaction chamber can be set to preferred values by adjusting the inert gas temperature and/or flow rate based on the data received from temperature and pressure sensors. The inert gas can be, for example, argon gas with less than three parts per million $O_2$, which is commercially available. Thus, the gas entering the reaction chamber first passes through a refrigeration device that includes a pump and one or more heat exchangers. The temperature of the inert gas is controlled by varying the heat exchanger's refrigerant temperature, which is managed by the system controller. The reaction chamber temperature is measured by one or more temperature sensors and the temperature data are provided to the system controller. One temperature sensor can be placed on a wall of the reaction chamber. Another one or two can be placed on or near the gas input port or ports of the reaction chamber. Depending on the embodiment, temperature can also be measured with a temperature sensor disposed on or near the reactant nozzle or dispenser. If additional temperature control is desired, the work piece holder that holds the deposition substrate can be placed in intimate contact with a dedicated heat exchanger for heating and cooling the deposition substrate as required by the chosen process. Such a dedicated heat exchanger can have its own thermal fluid that is separate from that of the inert gas heat exchanger. Such apparatuses and their associated control systems are commercially available. The associated control system of the substrate heat exchanger is under the command and control of the general system controller.

The pressure in the reaction chamber can be controlled over a very wide range of values from fractions of an atmosphere up to many atmospheres. This is achieved by a combination of options that include using the high pressure of the inert gas in its storage cylinder or tank (passive pressure control) and/or an additional pressure pump in combination with a vacuum pump at the effluent port of the reaction chamber (active pressure control). Typically, when pressurized gas from a high pressure tank is provided to the reaction chamber, it flows through a gas pressure regulator, which provides a "step-down" in pressure as a first order of pressure control. Additional control is achieved through the use of a pressure sensor or sensors that are disposed within the reaction chamber. For example, one pressure sensor can be placed on the reaction chamber wall but local to the general deposition area. In the placement of sensors, care is taken to avoid gas currents. If the reaction is performed at sub-atmospheric temperatures, a vacuum pump is used to maintain the lower pressure at the same time that inert gas continues to flow into the reaction chamber. If the reaction is performed above atmospheric pressures, passive pressure control (e.g., regulated tank pressure) and/or in combination. A valve can be used at the effluent port to control egress of the effluent gas.

Regardless of the pressure conditions chosen for a particular reaction, flow into, through, and out of the reaction chamber must be maintained. A controllable manifold can be used to provide kinetic energy to the gases to drive the molecular diamond forming reaction. By manipulating the gas regulator, inert gas pump, vacuum pump, and/or effluent valve based on temperature and pressure sensor data, the control system is able to set the preferred conditions for molecular diamond formation.

In vapor phase embodiments of the present invention, flow control may be achieved with a non-contact flow sensor or sensors (e.g., ultrasonic flow sensor) in the inert gas input port or ports of reaction chamber. For the embodiment of FIG. 6, the ganged reactant delivery apparatuses may include flow control preferably through the use of non-contact flow sensors. These can be embedded in the walls of the conduits or nozzles. This approach can be used for either of the vapor phase reactions of FIG. 1. The feedback control loop for controlling flow is regulated by the system controller through a reactant gas pump and/or a throttling valve. In solid state embodiments, precise amounts of homogeneous reactant solution can be delivered or dispensed by the use of well-calibrated metering pumps. This also applies to homogeneous reactant solution volumes injected into molds as shown in FIG. 7 and to the additive manufacturing process shown in FIG. 8.

The effluent port is attached to the input port of a GC-MS spectrometer, which generally has its own controllable pump system. The GC-MS spectrometer can monitor effluent either continually or periodically and provide effluent content data to the system controller. Process control may be based upon compositional data, physical parameter data, relative positional data, morphological data of the molecular diamond mass, etc. Mass spectrometer software is available both commercially and as open source programs that can be easily used in combination with the control system of the present invention.

Three-dimensional positioning of dispensers (e.g., automated pipetting systems), printing devices and other actuators and control systems therefor are well-developed technologies. A wide range of products for accomplishing the manufacturing processes shown in FIGS. 6-8 are available commercially and can be adapted to work in combination, and interface, with the control system of the present invention. For example, the reactant delivery apparatuses of FIGS. 6-8 can be achieved using three-dimensional positioning devices (e.g., a 3 D printer gantry, etc.) and their associated control software.

The control system software for the present invention not only maintains preferred reaction conditions but also controls the proper sequence of events. For example, the switchable high-energy discharge apparatus can be actuated on and off depending on the effluent data provided by the mass spectrometer. The control system software can be written in a variety of programming languages, but it is particularly useful to use languages that provide bit-level addressing and manipulation, such as C or C++, because these allow for easy interfacing with input and output ports (e.g., reading from or writing to A/D and D/A converters directly, respectively). Otherwise, interface routines can be coded in assembly language and control processing can be done in a higher level language. Alternatively, instrument control software development systems are available commercially (e.g., LabVIEW or LabWindows/CVI from National Instruments) that can be adapted to develop the control system software for the present invention.

Having described the present invention, it will be apparent to one skilled in the art that modifications and changes may be made to the above-described embodiments without departing from the spirit and scope of the present invention.

What is claimed is:

1. A method of forming a diamond mass upon a substrate by combinatorial synthesis, which comprises reacting a tetrahedranoidal molecule selected from the group consisting of benzvalene, 2,3,4-methynyl cyclobutanone and 3,4-diazabenzvalene with a carbon atom under inert gas to deposit a five-carbon atom molecule upon at least a portion of said substrate, and producing said diamond mass therefrom from a plurality of said five carbon atom molecules upon said at least a portion of said substrate.

2. The method of claim 1, wherein the forming of the diamond mass is conducted in vapor phase.

3. The method of claim 1, wherein the forming of the diamond mass is conducted in solid state.

4. The method of claim 1, which further comprises introducing a dopant into the diamond mass.

5. The method of claim 1, wherein said diamond mass formed is of predetermined morphology.

6. The method of claim 5, wherein said predetermined morphology is defined by a mold.

7. The method of claim 5, wherein said predetermined morphology is defined by a series of programmed deposition events.

8. The method of claim 5, wherein said predetermined morphology is defined by dispensing a homogeneous mixture of a plurality of tetrahedranoidal molecules and carbon source molecules at a plurality of locations relative to said substrate, and causing said tetrahedranoidal molecules to react with single carbon atoms to form said diamond mass.

9. The method of claim 1, which further comprises removing at least a portion of the substrate from the formed diamond mass.

10. The method of claim 1, which further comprises removing at least a portion of the formed diamond mass.

11. The method of claim 1, which further comprises removing the substrate from the formed diamond mass entirely.

12. The method of claim 1, which further comprises removing the formed diamond mass in the entirety from the substrate.

13. A method of forming diamond mass by combinatorial synthesis, which comprises steps of, in a first reaction, reacting a tetrahedranoidal molecule selected from the group consisting of benzvalene, 2 3 4-methynyl cyclobutanone and 3,4-diazabenzvalene with a carbon atom under inert gas to form a five carbon atom molecule, wherein said five carbon atom molecule is deposited upon at least a portion of said substrate to form a first diamond mass from a plurality of said five carbon atom molecules, and, in a second reaction, reacting a tetrahedranoidal molecule selected from the group consisting of benzvalene, 2,3,4-methynyl cyclobutanone and 3,4-diazabenzvalene with a carbon atom under inert gas to form a five carbon atom molecule, wherein said five carbon atom molecule is deposited upon at least a portion of said first diamond mass to form a second diamond unit mass thereon from a plurality of said five carbon atom molecules.

14. The method of claim 13, which does not use a diamond seed.

15. The method of claim 13, which further comprises stopping said first reaction, and then starting said second reaction.

16. The method of claim 15, wherein said stopping said first reaction, and then starting said second reaction is effected in order to control morphology of said first and second diamond masses.

* * * * *